(12) United States Patent
Choudhury

(10) Patent No.: US 8,426,290 B1
(45) Date of Patent: Apr. 23, 2013

(54) SUSPENDED-MEMBRANE/SUSPENDED-SUBSTRATE MONOLITHIC MICROWAVE INTEGRATED CIRCUIT MODULES

(75) Inventor: Debabani Choudhury, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 52 days.

(21) Appl. No.: 12/888,331

(22) Filed: Sep. 22, 2010

Related U.S. Application Data

(62) Division of application No. 11/324,066, filed on Dec. 29, 2005, now Pat. No. 7,825,440.

(51) Int. Cl.
*H01L 21/76* (2006.01)
*H01L 21/4763* (2006.01)

(52) U.S. Cl.
USPC .......................... 438/411; 438/619

(58) Field of Classification Search .................. 438/214, 438/280, 411, 619; 257/E23.011, E23.174, 257/E29.022
See application file for complete search history.

(56) References Cited

U.S. PATENT DOCUMENTS

| | | | |
|---|---|---|---|
| 4,180,422 A | 12/1979 | Rosvold | |
| 5,233,219 A | 8/1993 | Shimoji et al. | |
| 5,737,052 A | 4/1998 | Kimura | |
| 6,753,205 B2 * | 6/2004 | Halahan | 438/107 |
| 7,825,440 B1 | 11/2010 | Choudhury | |

OTHER PUBLICATIONS

U.S. Appl. No. 11/324,066, filed Dec. 29, 2005, Choudhury.
Siegel, P., et al., "2.5-Thz Monolithic Membrane-Diode Mixer," IEEEE Transactions on Microwave Theory and Techniques, vol. 47, No. 5 (May 1999).
Weinreb, S., et al., "High-Gain 150-215-Ghz MMIC Amplifier with Integral Waeguide Transitions," IEEE Microwave and Guided Wave Letters, vol. 9, No. 7 (Jul. 1999).

* cited by examiner

*Primary Examiner* — Hung Vu
(74) *Attorney, Agent, or Firm* — Ladas & Parry

(57) ABSTRACT

A device and a method for manufacturing it are disclosed. The device contains a plurality of transistors, a plurality of transmission mediums connected to the transistors; and a substrate having a first portion supporting the transistors and the transmission mediums thereon, and further having a plurality of discrete second portions extending from the first portion. The method disclosed teaches how to manufacture the device.

19 Claims, 31 Drawing Sheets

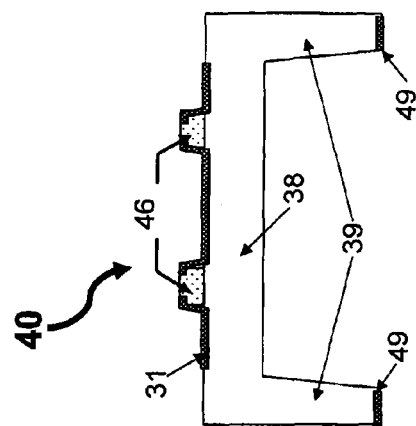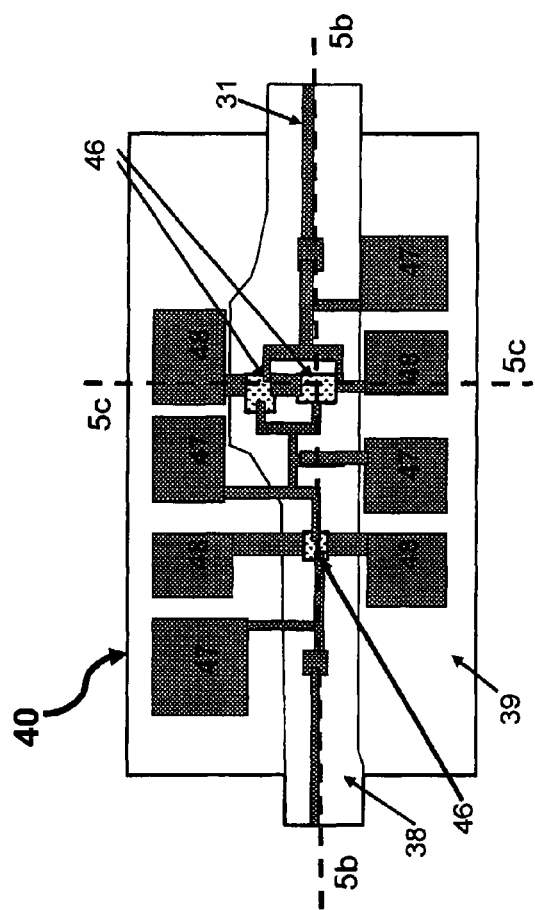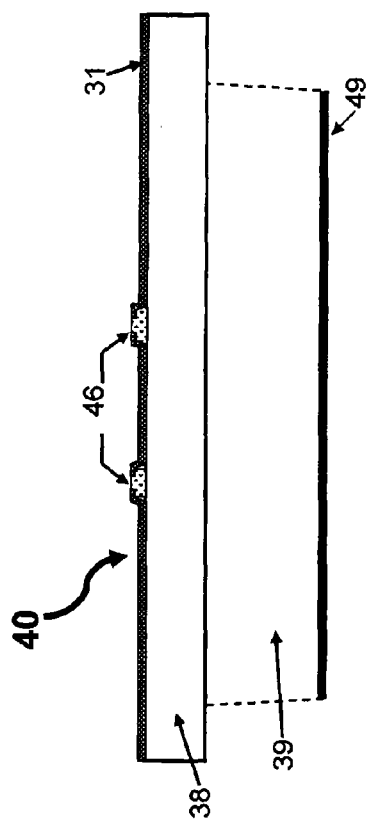

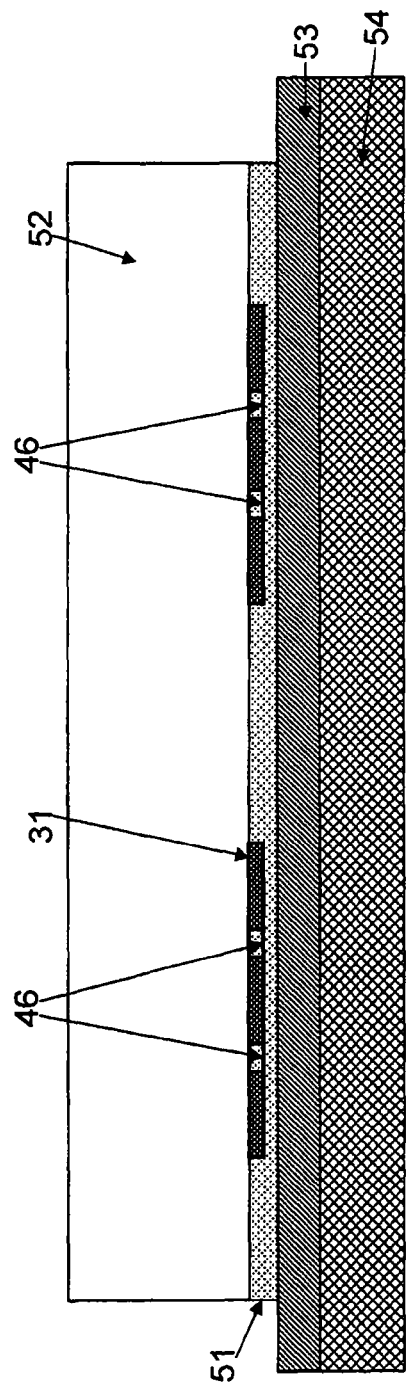
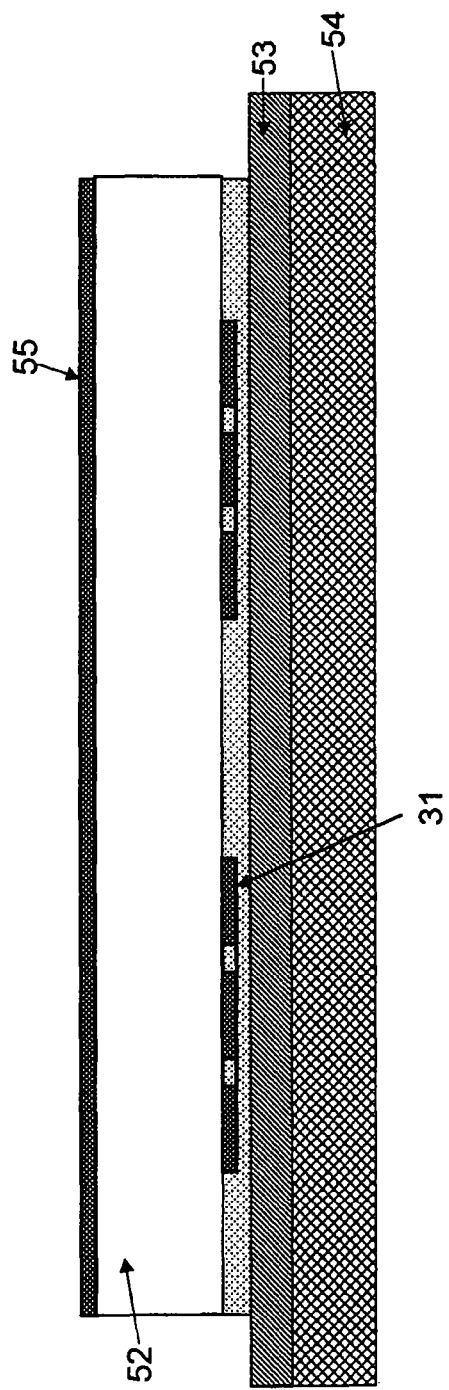
Figure 8a
Figure 8b

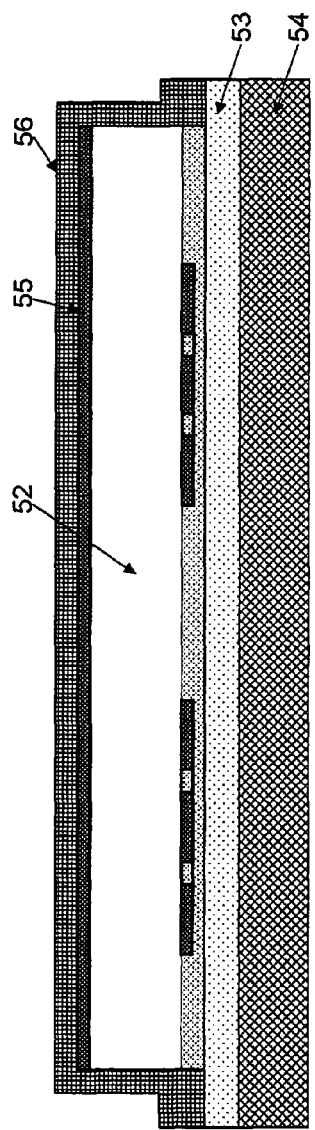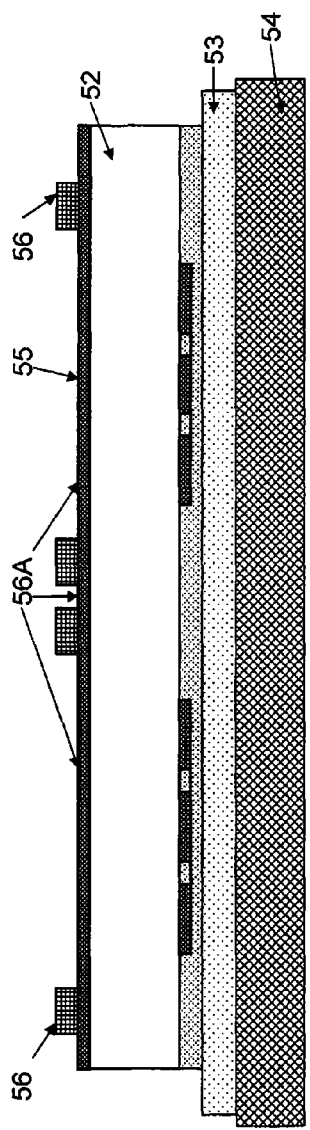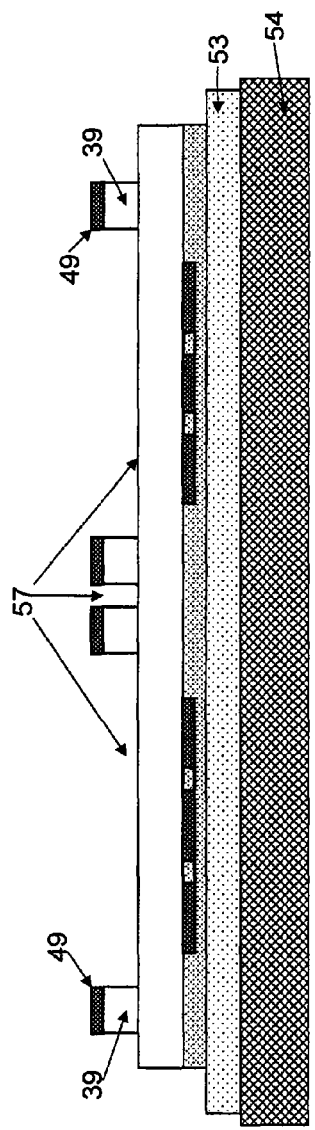

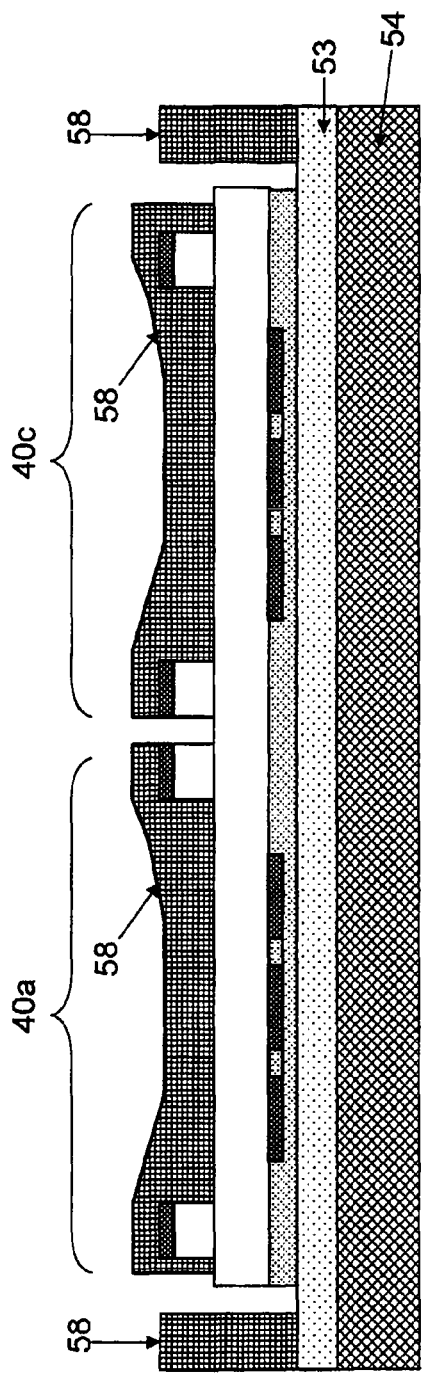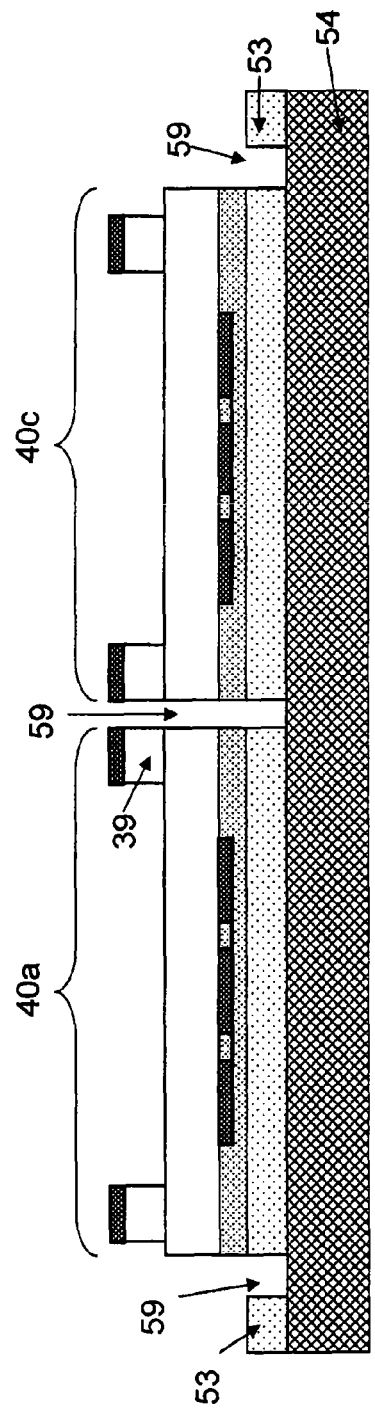

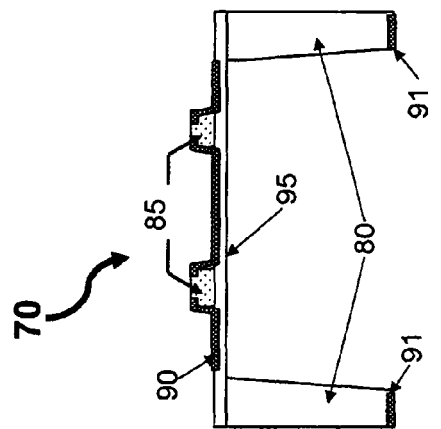
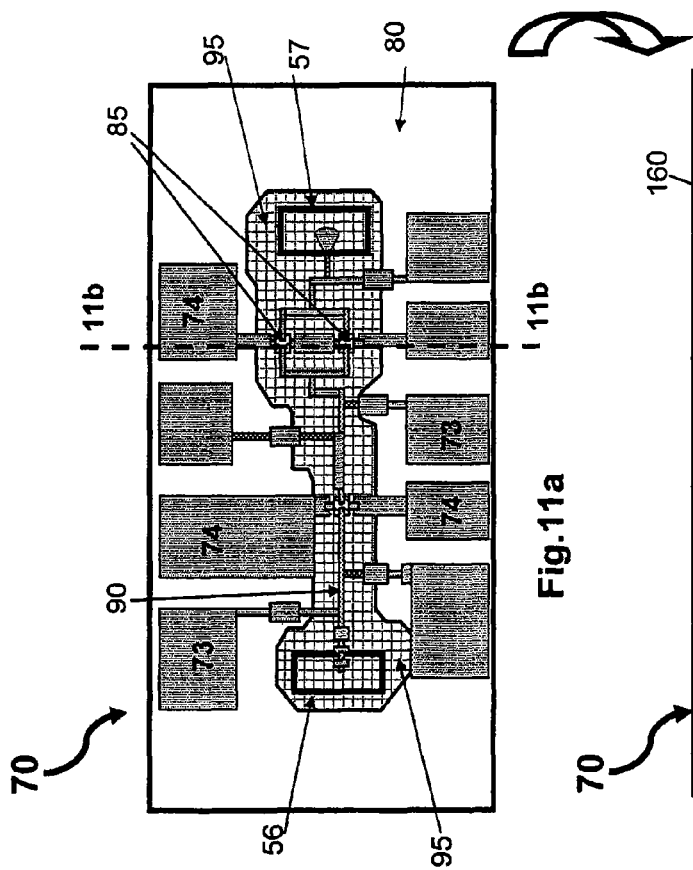
Fig.11a
Fig.11b
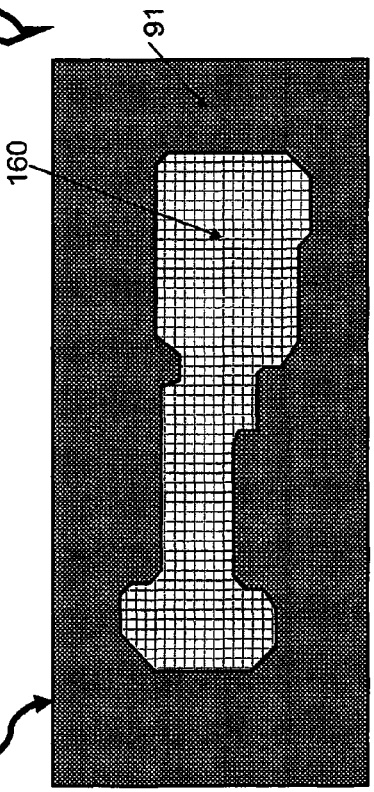
Fig.11c

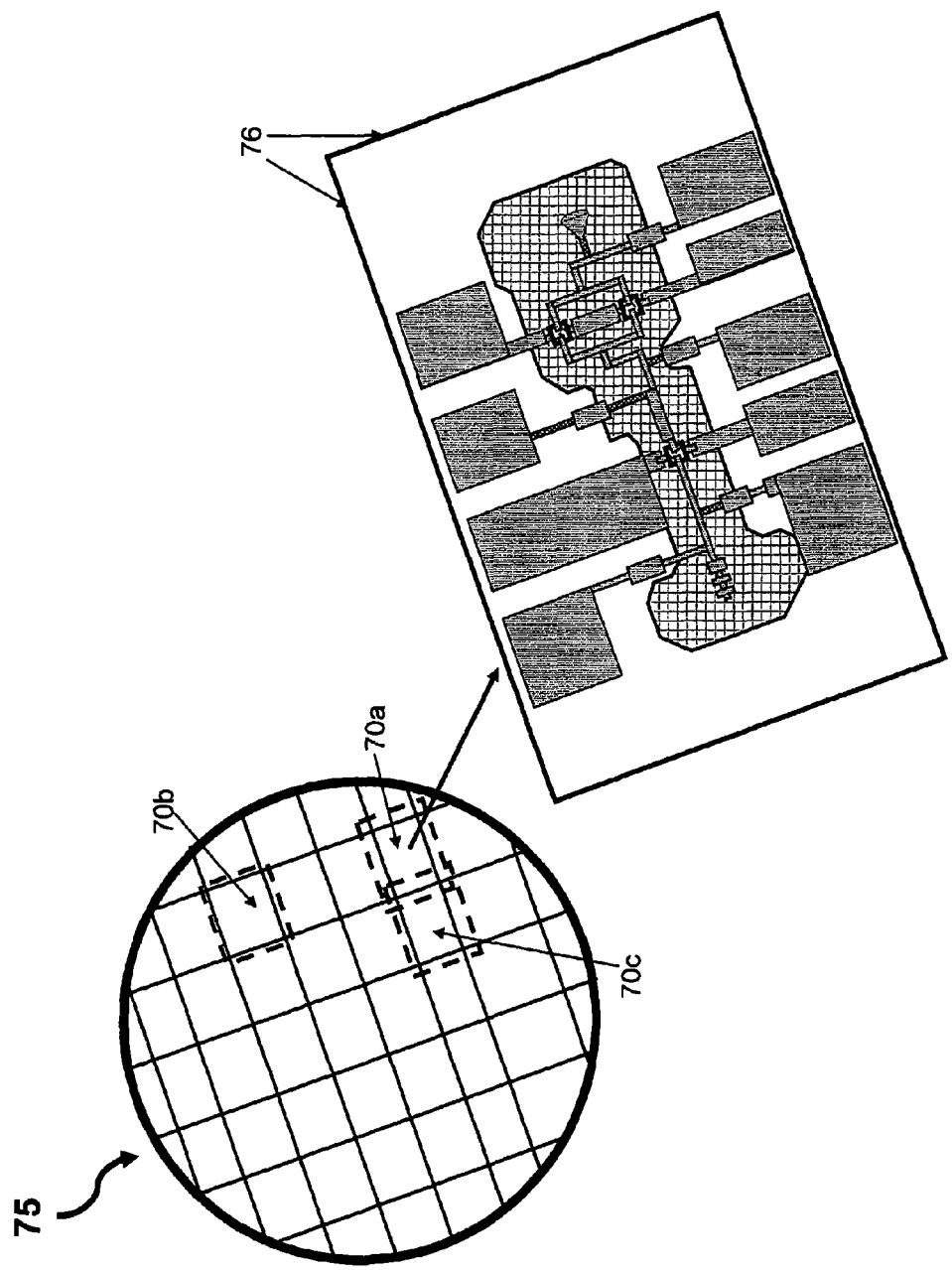

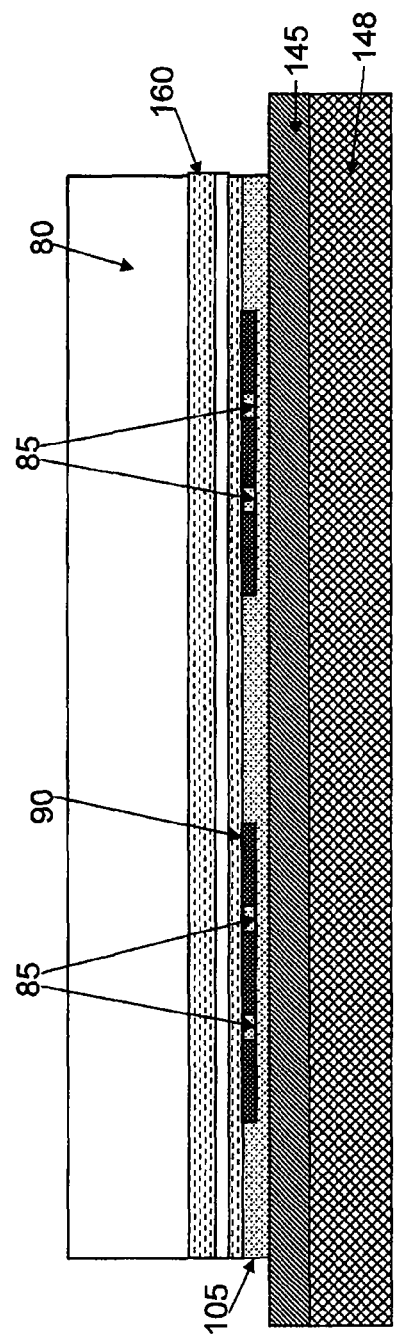
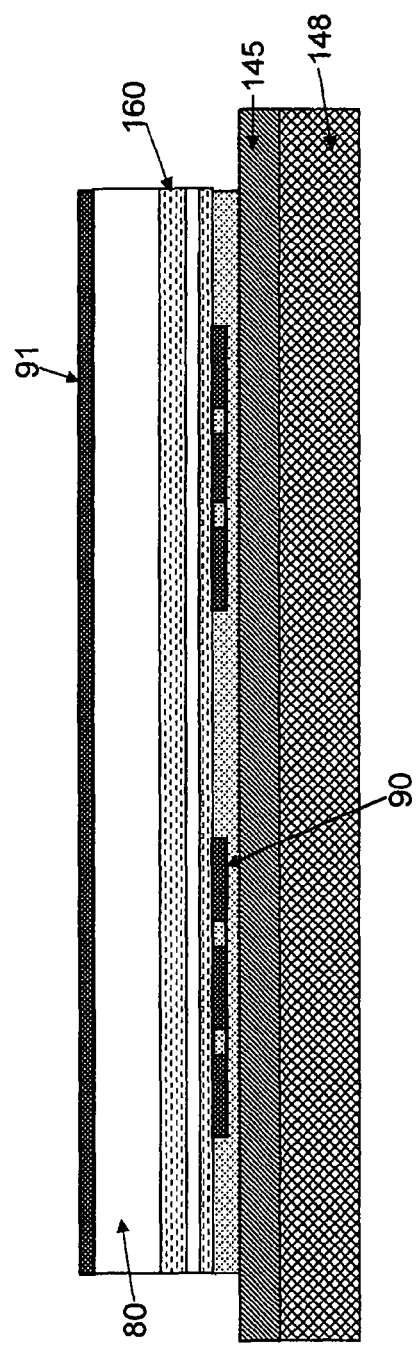

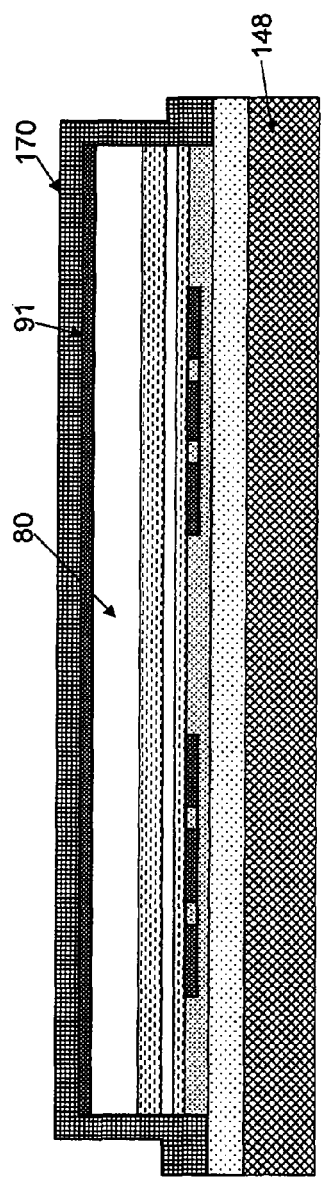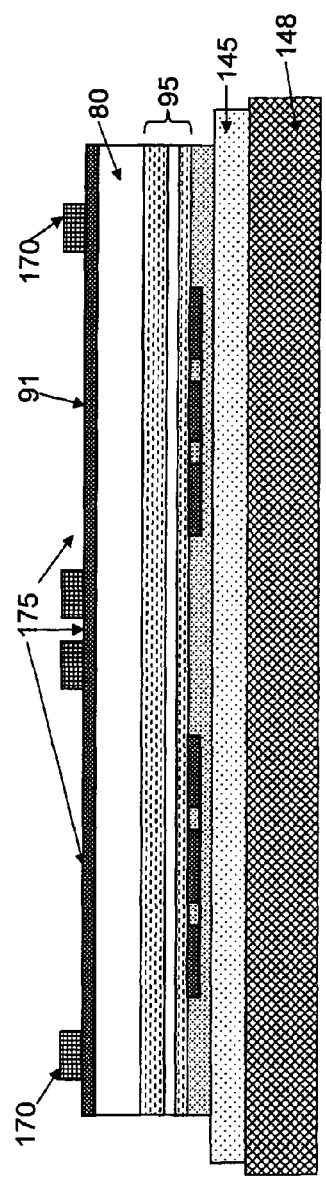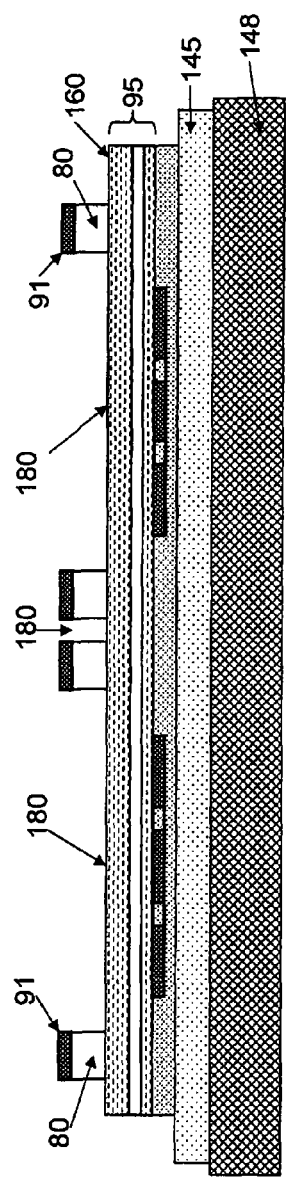

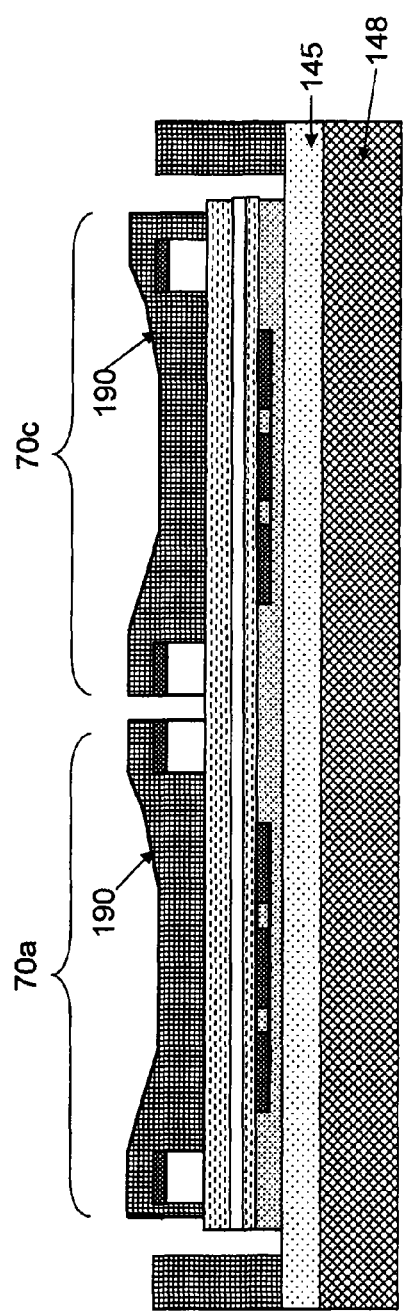
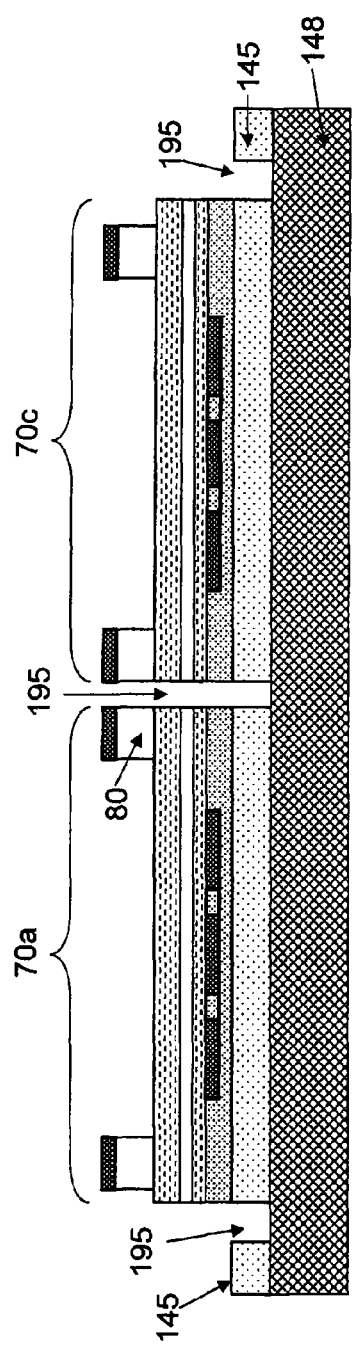
Figure 14f
Figure 14g

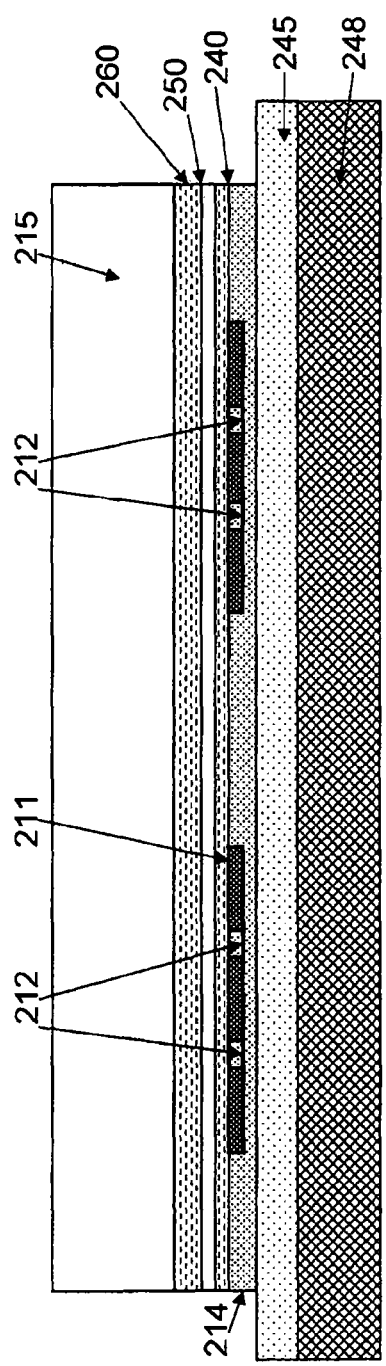
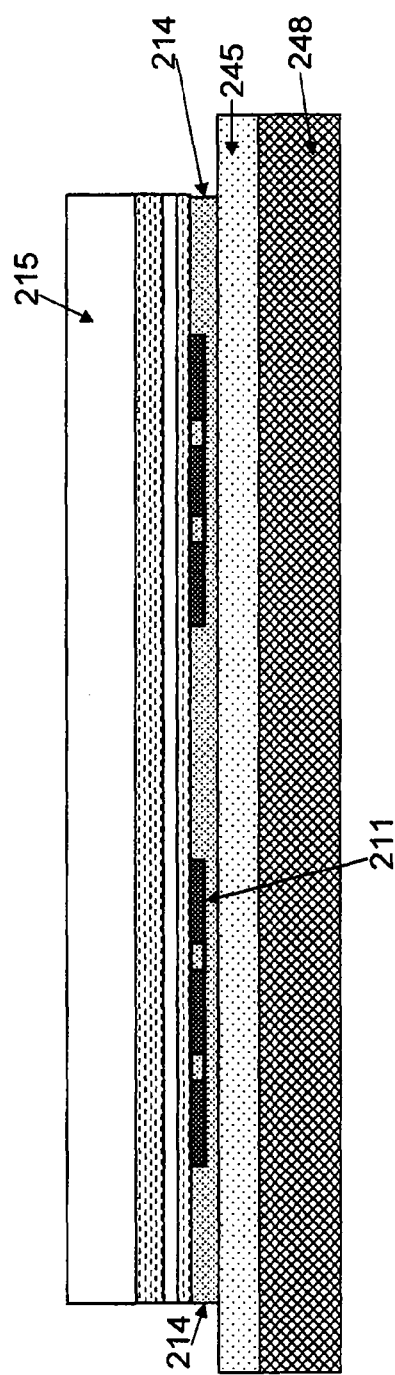

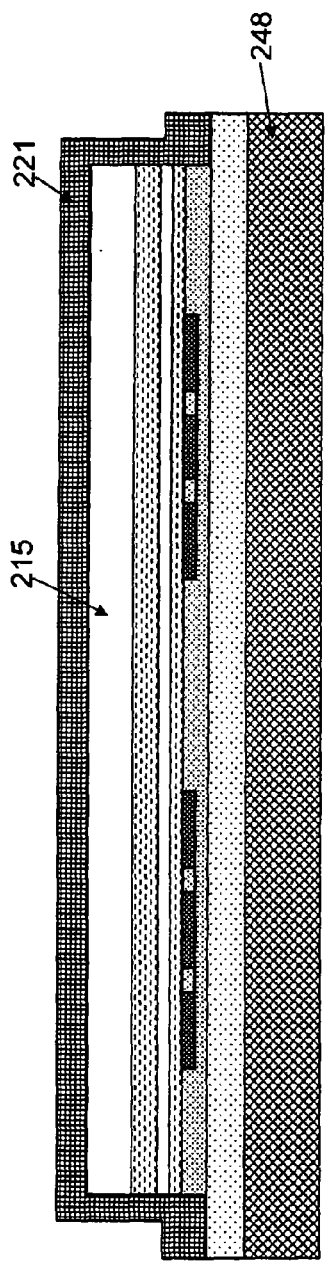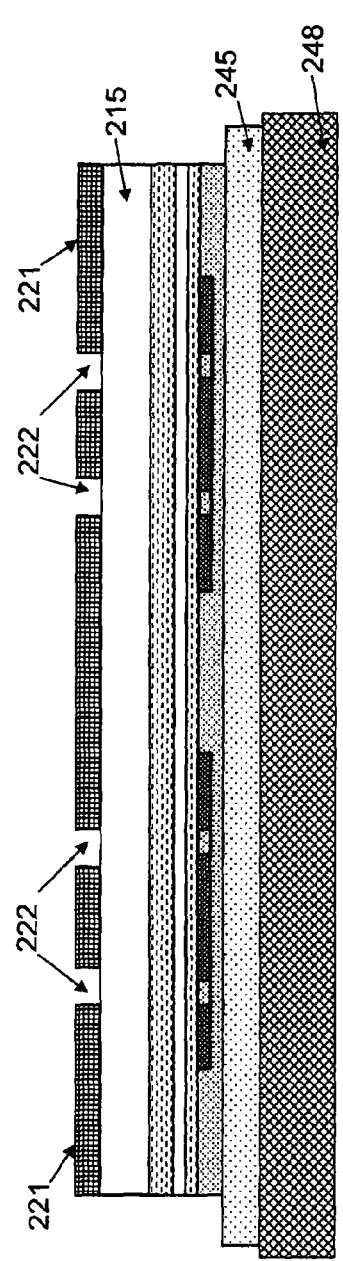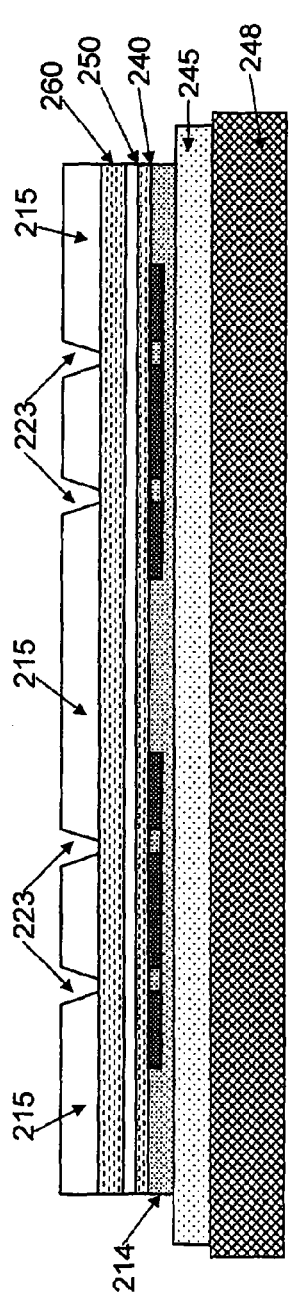

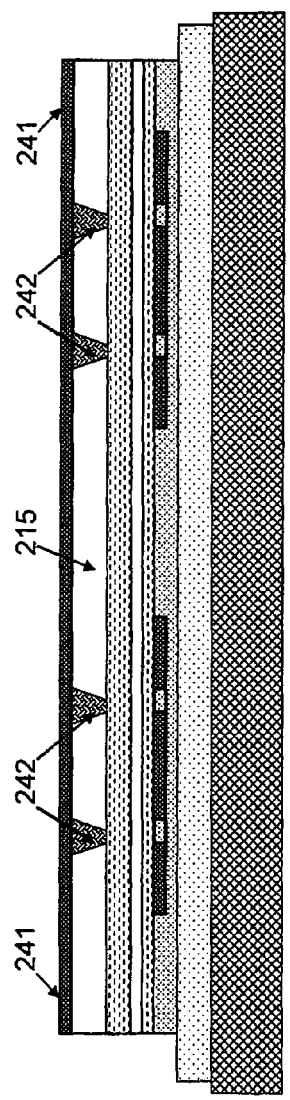
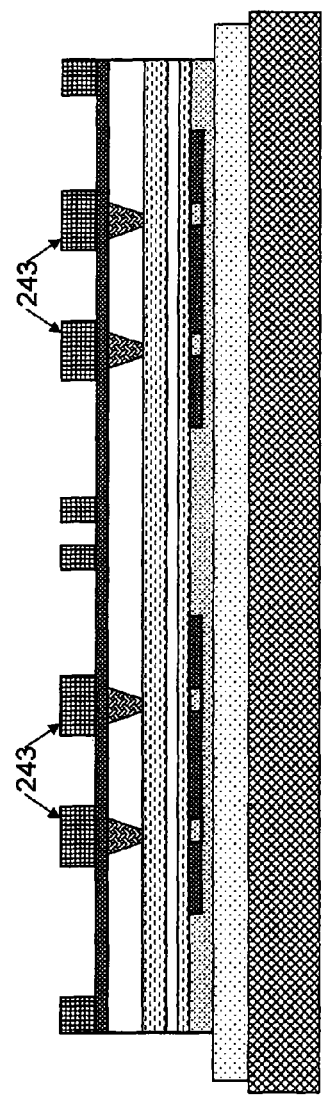
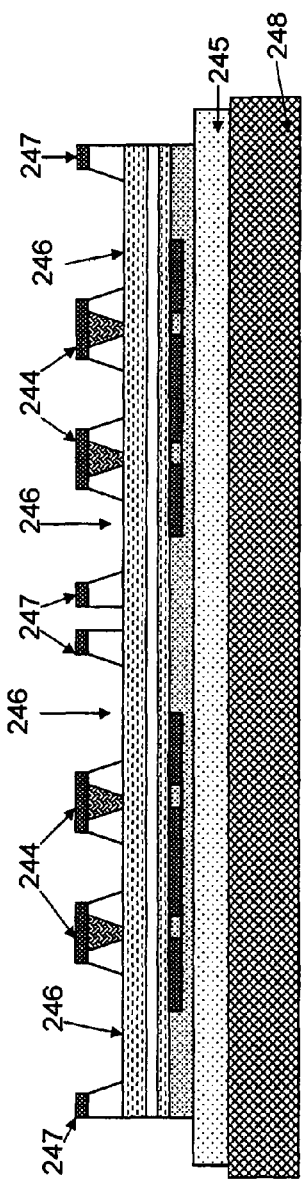
Figure 20f
Figure 20g
Figure 20h

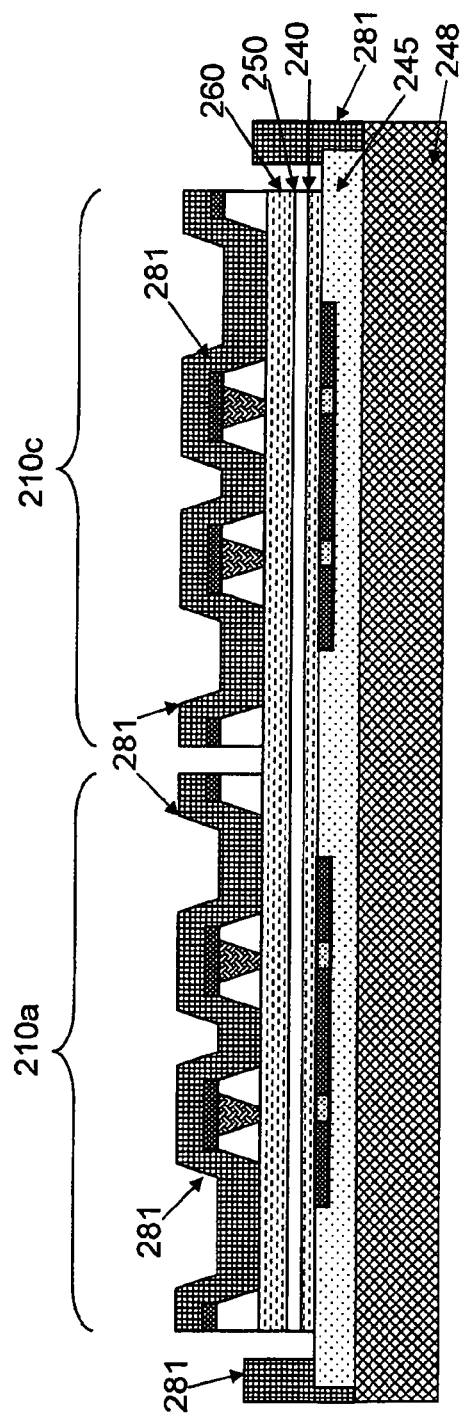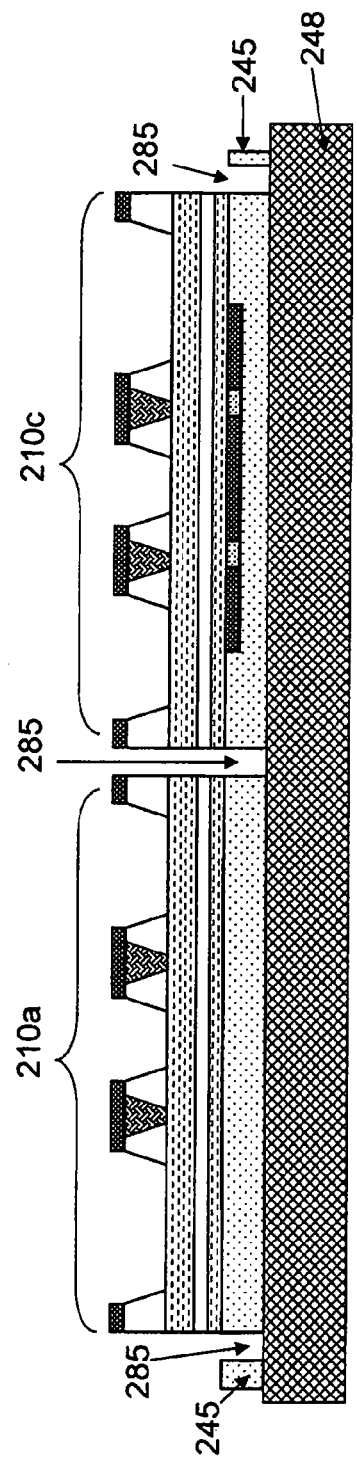

SUSPENDED-MEMBRANE/SUSPENDED-SUBSTRATE MONOLITHIC MICROWAVE INTEGRATED CIRCUIT MODULES

CROSS-REFERENCE TO RELATED APPLICATIONS

This application is the divisional of U.S. patent application Ser. No. 11/324,066 filed on Dec. 29, 2005, the disclosure of which is incorporated herein by reference in its entirety.

STATEMENT REGARDING FEDERALLY SPONSORED RESEARCH

The present invention was made with support from the United States Government under Grant number F33615-99-C-1512, awarded by the Air Force Research Laboratories and DARPA-ETO. The United States Government has certain rights in the invention.

FIELD

The present disclosure relates to higher-millimeter- and submillimeter-wave Monolithic Microwave Integrated Circuits (MMICs). More particularly, the present disclosure relates to MMIC modules that exhibit low loss at submillimeter wave frequencies and minimize parasitic modes in a waveguide environment.

BACKGROUND

Current Monolithic Microwave Integrated Circuits (MMICs) technologies, developed using semiconductors like, InP, GaAs, SiGe, GaN, etc., are typically not suitable for operating at higher-millimeter-wave and submillimeter-wave frequencies. FIG. 1 depicts a lower half of a conventional MMIC module split-block 1. The close-up view 2 of the MMIC module 1 shows the MMIC-to-waveguide transitions 3 being bonded to a conventional MMIC chip 4 with wire bonding 6. The MMIC chip 4 was designed on a 50 μm thick InP substrate in the channel of a split-waveguide block.

FIG. 2 depicts a cross-section of another conventional MMIC chip 10. The conventional MMIC chip 10 may contain devices 12, on a substrate 11, that are connected to a Grounded Coplanar Waveguide (GCPW) (not shown) or to microstrip transmission mediums 14 that may be connected to a ground plane 16 through ground pads 15 and substrate vias 17. As known in the art, the devices 12 may be formed through a frontside processing of a wafer containing the MMIC chip 10.

At high-mm-wave and sub-mm-wave frequencies, the transmission mediums 14 exhibit high-parasitic effects with high loss values when disposed on the thick semiconductor substrate 11. Further, when the conventional MMIC chip 10 is placed in a waveguide module 20, the performance of the MMIC degrades due to parasitic effects. FIG. 3 depicts a conventions MMIC chip disposed on a waveguide module 20. The waveguide module 20 may contain an upper split-block section 26 disposed above the MMIC chip 10; a lower split-block section 25 disposed below the MMIC chip 10; an input waveguide 27 formed by the upper split-block section 26 and the lower split-block section 25; an output waveguide 28 formed by the upper split-block section 26 and the lower split-block section 25; low-loss substrates 22 containing transitions 24 that are wirebonded 21 to the MMIC chip 10; metal patterns 23 disposed under the MMIC chip 10 and substrates 22 for transitions 24; and an epoxy (not shown) that may be used to hold the MMIC chip 10 and the substrates 22 on the lower split-block section 25.

The high-losses introduced by transmission mediums 14 and substrate-moding effects introduced by semiconductor substrate 11 tend to degrade conventional MMIC chip 10's performance at submillimeter wave frequencies.

According to the present disclosure, MMIC chips formed using suspended membrane transmission structures exhibit lower loss at higher-millimeter-wave and submillimeter-wave frequencies and help to minimize parasitic modes in a waveguide environment. Further, according to the present disclosure, MMIC chips formed using suspended-substrate structures also present better performance than conventional MMIC chips at higher mm-wave and submm-wave frequencies.

PRIOR ART

Example of prior art includes:
1. Weinreb, S., Fater, T., Lai, R., Barsky, M., Leong, Y. C., Samoska, L., "High-Gain 150-215 GHz MMIC Amplifier with Integral Waveguide Transistions", IEEE Microwave and Guided Wave Letters, Vol. 9, No. 7, pp. 282-284, July 1999. Weinreb et al. developed a GCPW-based MMIC with integrated waveguide transitions. This approach presents a lossy MMIC module with higher order substrate parasitics at higher frequencies and exhibits degraded performance.
2. Peter H. Siegel, R. Peter Smith, Michael C. Gaidis and Suzanne C. Martin discusses "2.5-THz GaAs Monolithic Membrane-Diode Mixer" in IEEE Transactions on Microwave Theory and Techniques, v. 47, n. 5, pp. 596-604 (May 1999). Unlike present disclosure, Siegel discloses diode based passive circuits using membrane-based technology.

BRIEF DESCRIPTION OF THE FIGURES

FIGS. 5a-5c depict a top view and sectional side views of the SS-MMIC chip shown in FIG. 4 in accordance with the present disclosure;

FIGS. 8a-8g depict one exemplary method of making the SS-MMIC chip shown in FIG. 6 in accordance with the present disclosure;

FIGS. 11a-11c depict a top view, a sectional side view and a bottom view of the SM-MMIC chip shown in FIG. 10 in accordance with the present disclosure;

FIG. 12 depicts a top view of a semiconductor wafer containing the SM-MMIC chip shown in FIG. 10 in accordance with the present disclosure;

FIGS. 14a-14g depict one exemplary backside processing method for the SM-MMIC chip shown in FIG. 12 in accordance with the present disclosure;

FIGS. 20a-20j depict one exemplary backside processing method for the SM-MMIC chip shown in FIG. 18 in accordance with the present disclosure;

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

Figure 1:
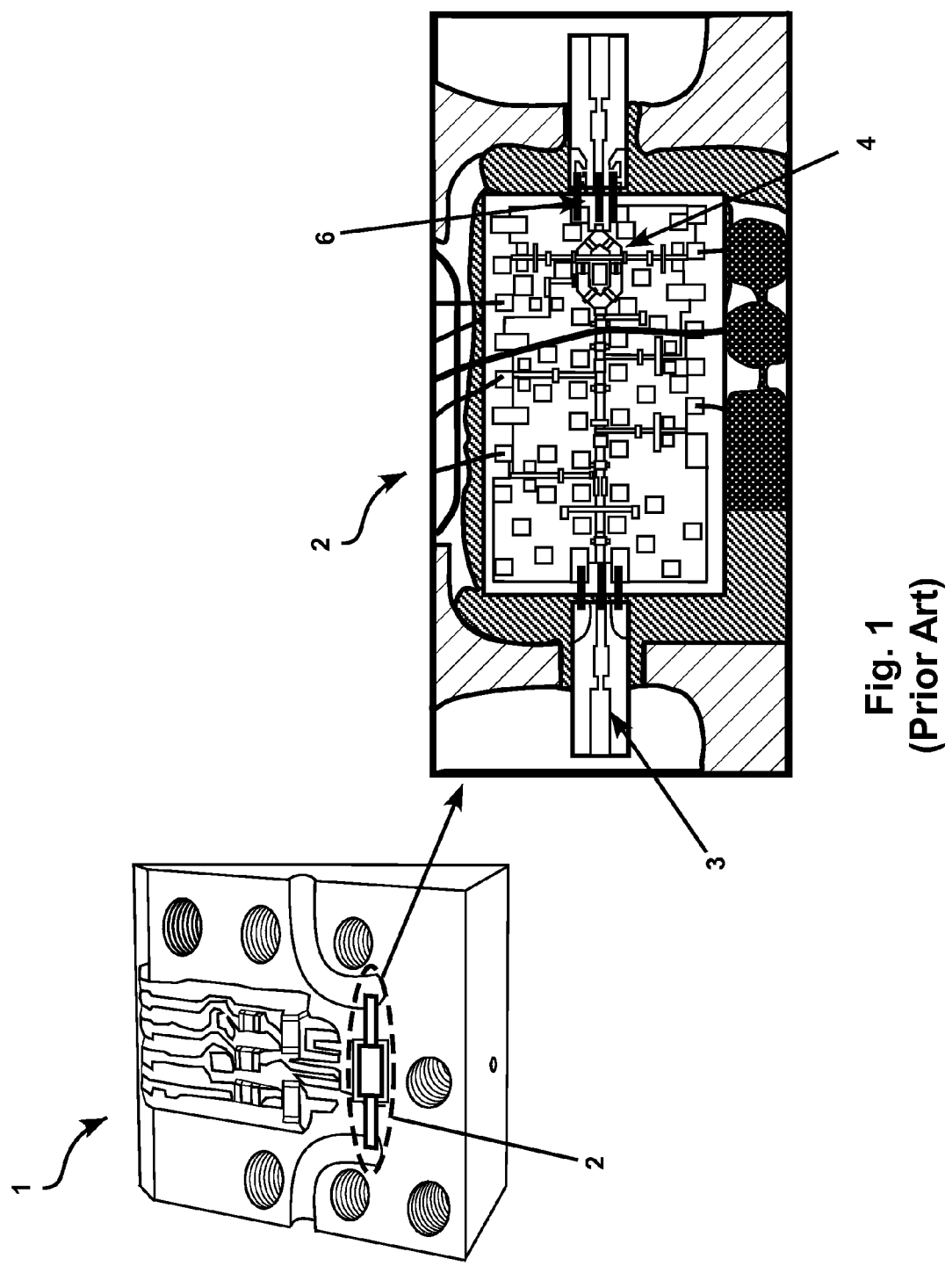
FIG. 1 relates to the Prior Art and depicts a portion of a conventional MMIC module containing a conventional MMIC chip.
Figure 2:
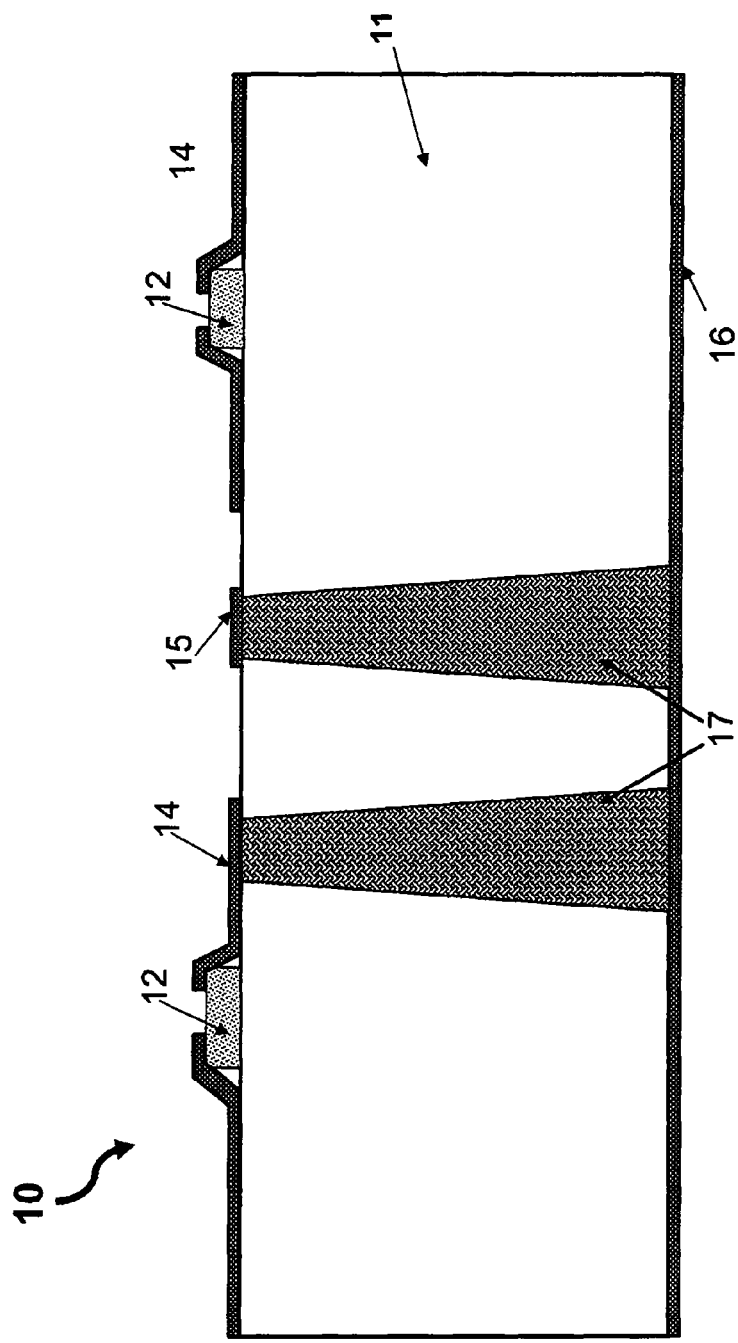
FIG. 2 relates to the Prior Art and depicts a side view of a conventional MMIC chip.
Figure 3:
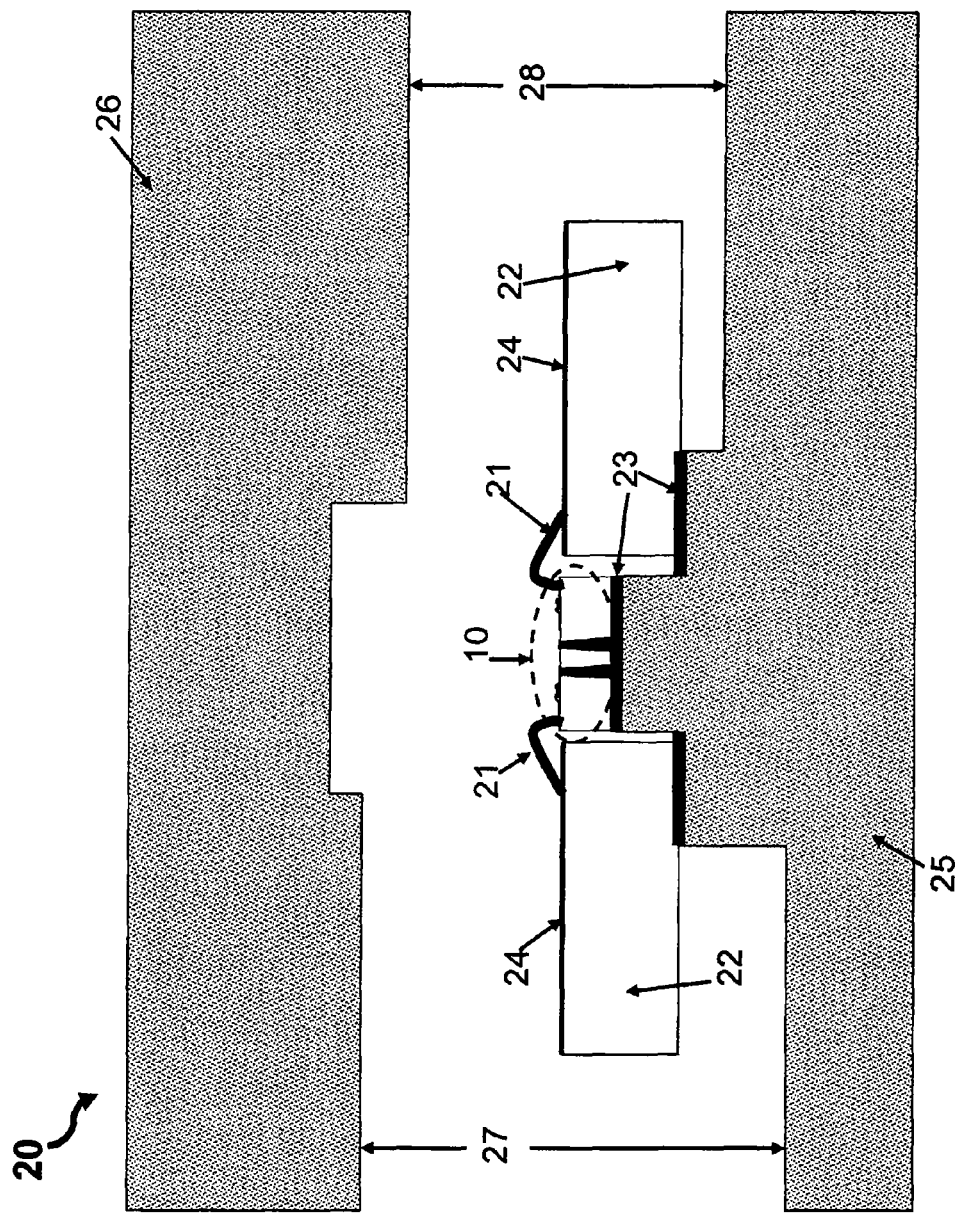
FIG. 3 relates to the Prior Art and depicts a side view of the conventional MMIC chip shown in FIG. 2 disposed in a conventional MMIC module.
Figure 4:
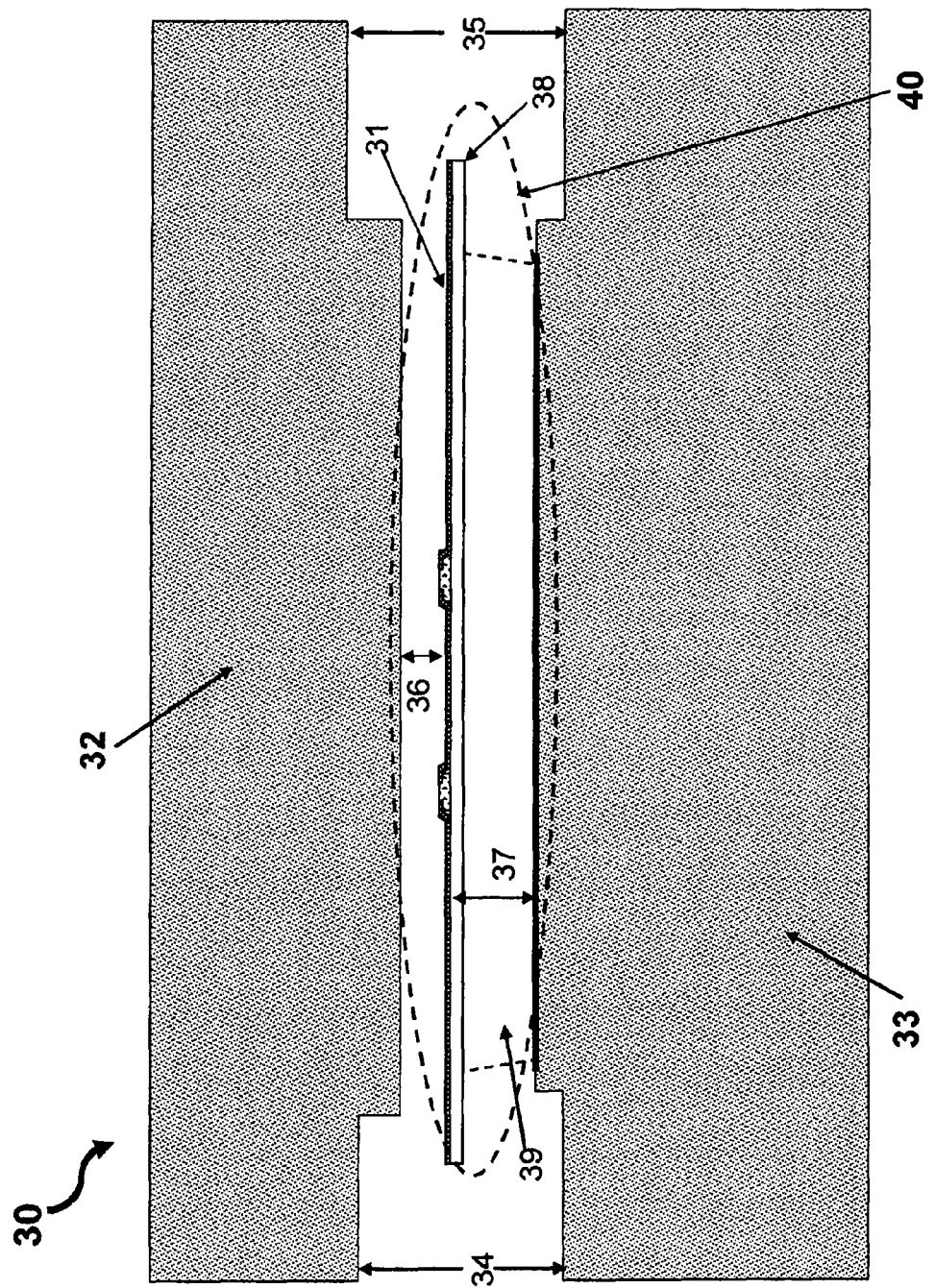
FIG. 4 depicts an exemplary Suspended-Substrate MMIC (SS-MMIC) module containing a SS-MMIC chip in accordance with the present disclosure.

In one exemplary embodiment, the present disclosure addresses the issues of high-losses and substrate parasitic modes in MMIC chips by disclosing a Suspended-Substrate MMIC (SS-MMIC) module 30 containing a SS-MMIC chip 40, as shown in FIG. 4. FIG. 4 depicts a cross-sectional view of the SS-MMIC module 30.

The SS-MMIC module 30 may contain a lower split-block 33; an upper split-block 32; the SS-MMIC chip 40 disposed between a lower split-block 33 and an upper split-block 32; an input waveguide 34 formed by the lower split-block 33 and the upper split-block 32; and an output waveguide 35 formed by the lower split-block 33 and the upper split-block 32.

The excessive losses and high-parasitic effects can be eliminated or reduced in the SS-MMIC chip 40 by etching away selected portions of high-resistivity substrate 39 underneath metal line 31 to form suspended-substrate 38 and create a suspended transmission line structure as shown in FIGS. 5a-c, 6, 7 and 8a-g. The thinning of the substrate 39 provides low-loss suspended-substrate metal lines 31 in the SS-MMIC chip 40 when placed inside the SS-MMIC module 30. The metal lines 31 on the suspended-substrate 38 may form signal lines between top and bottom ground planes defined by the upper split-block 32 and lower split-block 33. At sub-millimeter waves, the metal lines 31 on the suspended-substrate 38 may reduce the transmission line attenuation due to parasitic effects.

FIG. 5a depicts the top view of the SS-MMIC chip 40. FIG. 5b depicts a cutaway side-view of the SS-MMIC chip 40 along the line 5b-5b. FIG. 5c depicts a cutaway side-view of the SS-MMIC chip 40 along the line 5c-5c.

The SS-MMIC chip 40 may contain active devices 46 disposed on the suspended-substrate 38 and connected, for example, to transmission mediums 31, bias pads 47 and ground pads 48. An impedance of the transmission mediums 31 can be varied by changing a distance 36, that is the distance from the metal transmission line 31 to the upper split-block 32, and a distance 37, that is the distance from the transmission line 31 to the lower split-block 33, as shown in FIG. 4.

Figure 6:
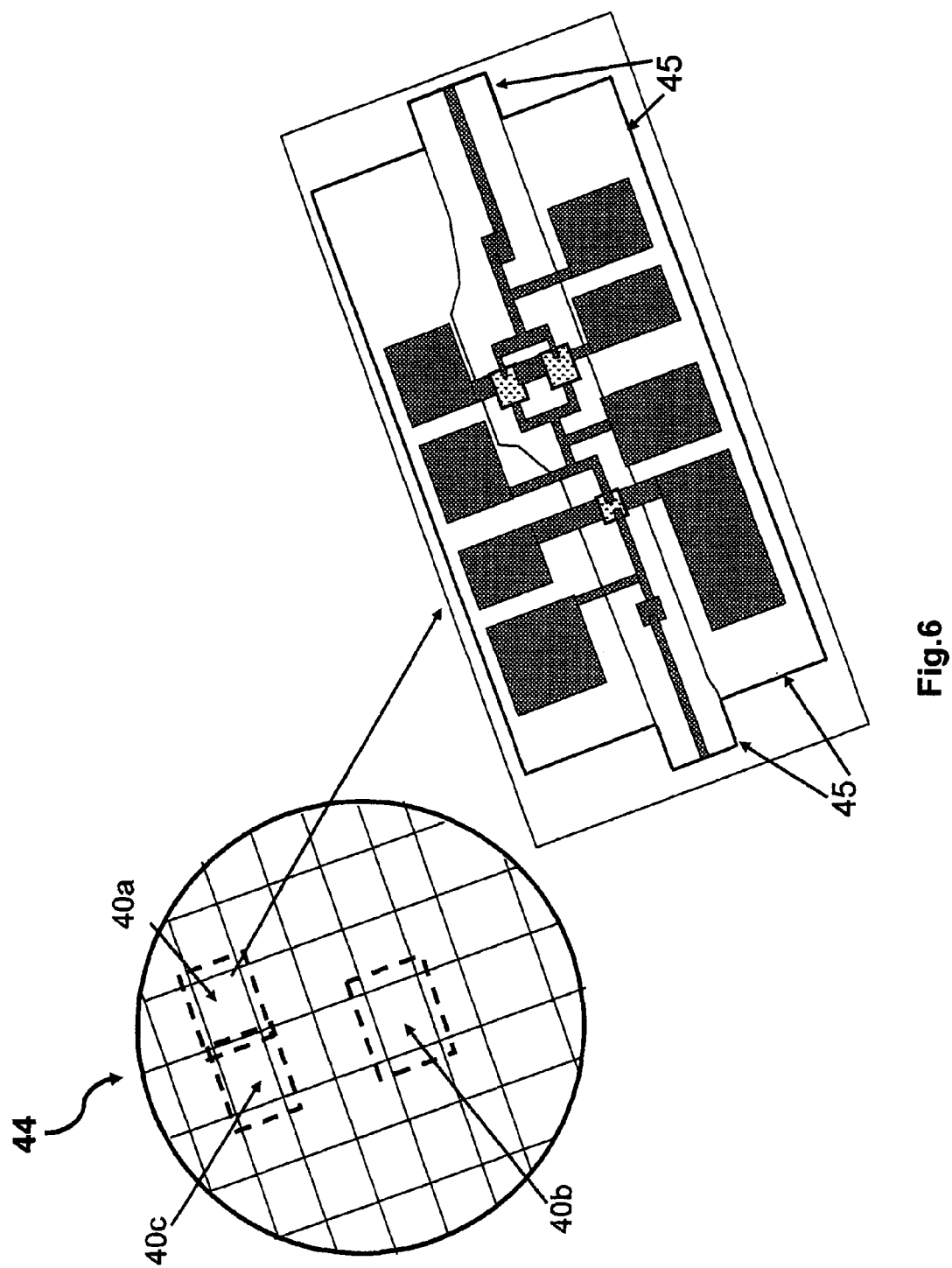
FIG. 6 depicts a top view of a semiconductor wafer containing the SS-MMIC chip shown in FIG. 4 in accordance with the present disclosure.

FIG. 6 depicts a top-view of an exemplary semiconductor wafer 44 and suspended-substrate MMIC chips 40a, 40b and 40c. The close up top-view of the MIMIC chip 40a depicts etch lines 45 that define the SS-MMIC chip 40a.

Figure 7:
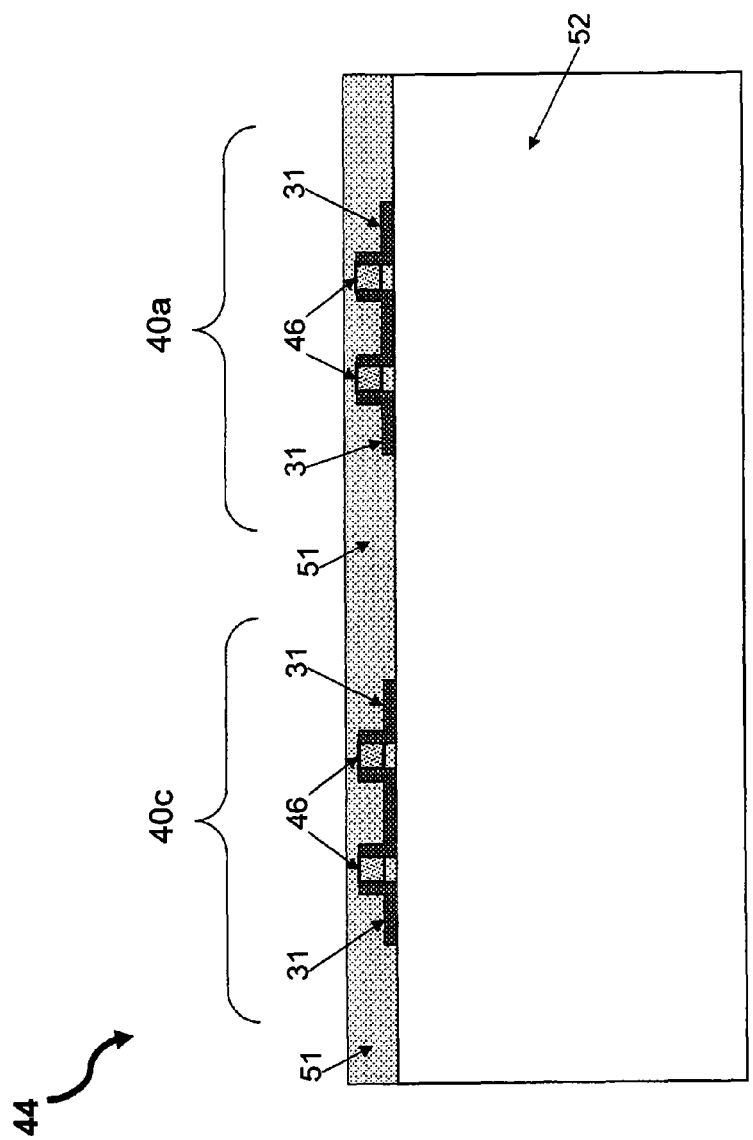
FIG. 7 depicts a side view of the SS-MMIC chips shown in FIG. 6 prior to the backside processing in accordance with the present disclosure.

FIG. 7 depicts the cross-section of at least a portion of the semiconductor wafer 44, containing, for example, MMIC chips 40a and 40c, after the completion of front-side processing as known to one skilled in the art and not described in detail herein. Devices 46 and metal lines 31 may be created using the epi-layers on a semiconductor substrate 52. A dielectric passivation layer 51 can be deposited on the front-side for protecting devices 46. The wafer 44 may contain multiple SM-MMIC chips 40a, b . . . , as shown in FIG. 6, that are to be separated from each other after the backside processing is complete as described below.

One exemplary method of backside processing a portion of the semiconductor wafer 44, containing MMIC chips 40a and 40c, is shown and described with reference to FIGS. 8a-g. FIGS. 8a-g represent the cross section of the wafer 44 in each of this backside process steps.

In FIG. 8a, the wafer 44 is mounted with the devices 46 and transmission mediums 31 on a support substrate 54 and held in place with a wax or other suitable material 53. The substrate 52 can, for example, comprise InP material.

In FIG. 8b, a thinning process is performed on the substrate 52. The thinning process can be performed, for example, either by lapping the substrate 52; by etching the substrate 52 (wet or dry); grinding the substrate 52; or by a combination of any of these processes. The backside of the thinned substrate 52 is then covered with metallization 55.

In FIGS. 8c-e, patterning of the substrate 52 is performed. The patterning process can be performed by: applying and imaging a mask 56 to the substrate 52, as shown by FIG. 8c; creating an etch pattern 56A in the etch mask 56, as shown by FIG. 8d; etching substrate holes 57 in the substrate 52 and removing the etching mask 56, as shown by FIG. 8e. The substrate holes 57 may be etched till the desired thickness of suspended-substrate 38 is reached. The etching mask 56 can be, but is not limited to, a photoresist material.

In FIGS. 8f and 8g, a disjoin process is performed on the substrate 52. Upon completion of the disjoin process the individual SS-MMIC chips 40a and 40c on the mounting substrate 54 will be disjoined from each other. The disjoin process can be performed by: applying and imaging an integrated circuit mask 58 to the substrate 52 exposing only the portions of the substrate 52 that are between the individual SS-MMIC chips 40a and 40c, as shown by FIG. 8l; etching through the substrate 52 as well as material 53 to create through streets 59 and removing the integrated circuit mask 58, as shown by FIG. 8g.

Alternatively, the process of disjoining the individual SS-MMIC chips 40a and 40c from the wafer 44 can be accomplished by a laser die cutting process instead of masking and etching. The laser cutter is guided where the cutting is to be performed. Upon completion of the laser die cutting process, the individual SS-MMIC chips 40a and 40c will be disjoined from each other, by dissolving the material 53.

Finally, removing the material 53 enables removal of the individual SS-MMIC chips 40a and 40c from the support substrate 54. The material 53 can, for example, may be removed with solvents, such as, Tetra-chloro-ethylene (TCE) for mounting on the split-block module.

This disclosure is not in any way limited by the shape or thickness of the substrate 52 as depicted in FIGS. 4 through 8.

Figure 9:
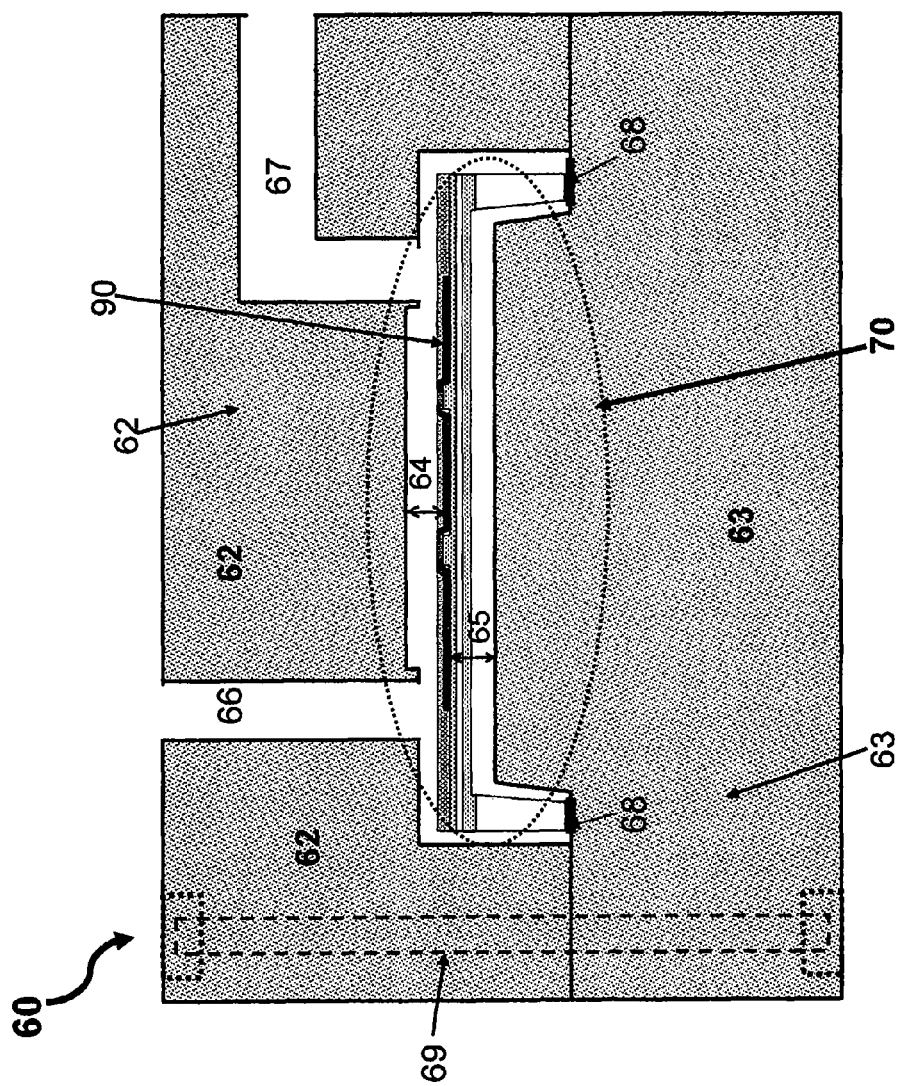
FIG. 9 depicts an exemplary Suspended-Membrane MMIC (SM-MMIC) module containing a SM-MMIC chip in accordance with the present disclosure.

In another exemplary embodiment, the present disclosure addresses the issues of high-losses and substrate parasitic modes in MMICs by disclosing a Suspended-Membrane MMIC (SM-MMIC) module 60 containing a SM-MMIC chip 70, as shown in FIG. 9. FIG. 9 depicts a cross-sectional view of the SM-MMIC module 60.

The SM-MMIC module 60, in FIG. 9, may contain the SM-MMIC chip 70 disposed between a lower split-block 63 and an upper split-block 62; an input waveguide 66 may be formed in the upper split-block 62; and an output waveguide 67 may be formed in the upper split-block 62. The SM-MMIC module 60 may also contain metal contacts 68 to support the SM-MMIC chip 70 and a fastener 69 for holding the upper split-block 62 and the lower split-block 63 together.

This disclosure is not in any way limited to the coupling of the transmission line and the input and output waveguides as shown in FIG. 9. Other methods of input/output line-to-waveguide coupling can be designed and implemented.

Figure 10:
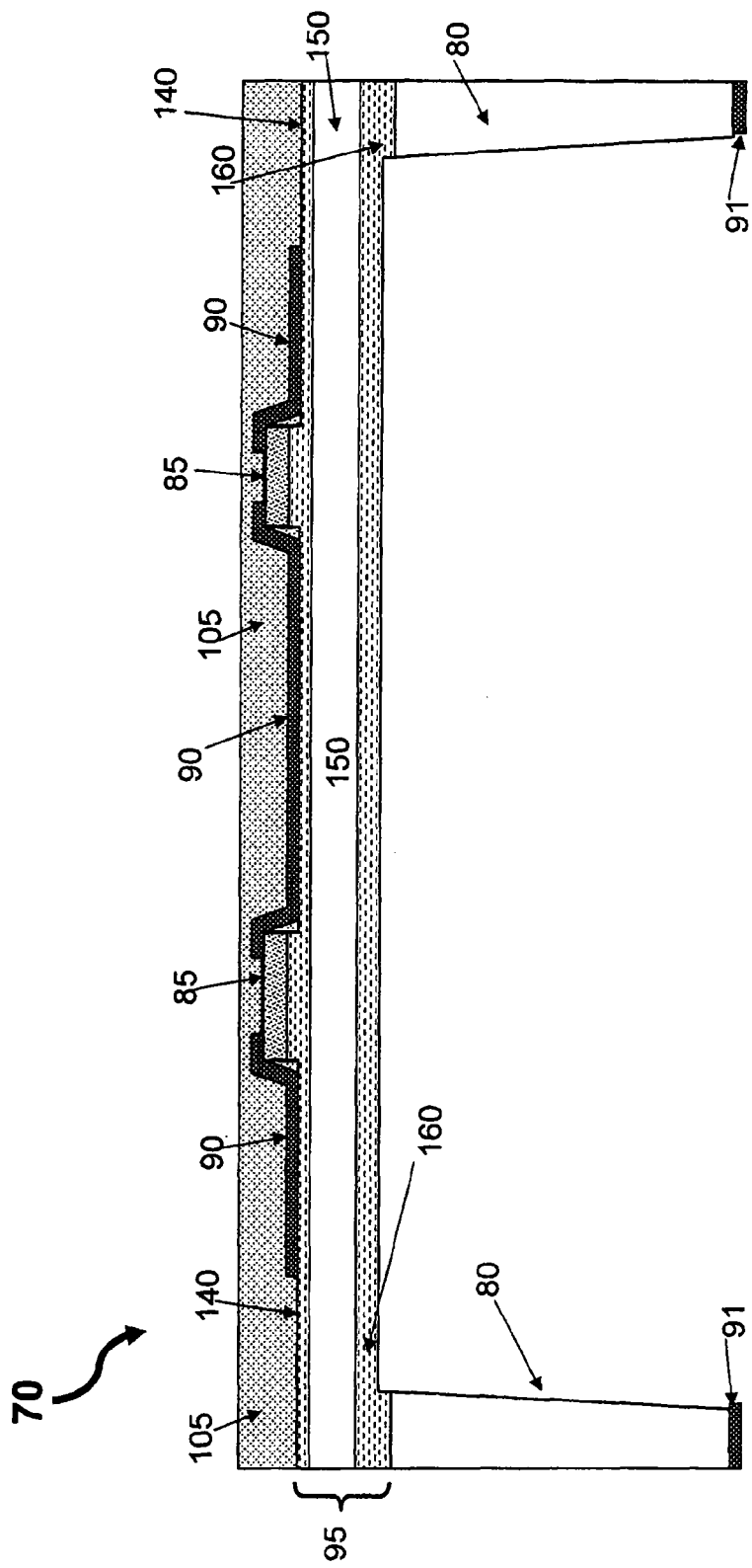
FIG. 10 depicts a side view of the SM-MMIC chip shown in FIG. 9 in accordance with the present disclosure.

Referring to FIG. 10, the SM-MMIC chip 70 may consists of three-terminal devices 85 connected to transmission mediums 90 that are supported by a substrate 80 with a portion of substrate material removed. For extra support, the SM-MMIC chip 70 may also contain membrane layer 150 sandwiched between etch-stop layers 140 and 160 that are disposed between the three-terminal devices 85 and the substrate 80. A suspended-membrane 95 is a combination of layers 140, 150 and 160 as shown in FIG. 10. The removal of the portion of substrate material from the substrate 80 up to the stop layer 160 reduces SM-MMIC chip 70's high losses at higher-millimeter-wave and submillimeter-wave frequencies and parasitic modes when used as a suspended transmission structure. The SM-MMIC chip 70 may also contain a protective dielectric material 105 disposed above the devices 85.

FIG. 11a depicts the top view of the SM-MMIC chip 70. FIG. 11b depicts the cutaway cross-section of the SM-MMIC chip 70 along the line 11b-11b. FIG. 11c depicts the bottom-view of the SM-MMIC chip 70.

As shown in FIG. 11a, the SM-MMIC chip 70's devices 85 are disposed on the suspended-membrane 95 formed by etching portions of support-substrate 80 and connected to transmission mediums 90, bias pads 73 and ground pads 74. The suspended-membrane 95 may be formed by the combination of etch-stop layer 140, membrane layer 150 and another etch-stop layer 160 as shown in FIG. 10. The characteristics of the transmission mediums 90 can be varied by changing distance 64, that is the distance from the transmission mediums 90 to the upper split-block 62, and distance 65, that is the distance from the transmission medium 90 to the lower split-block 63 as shown in FIG. 9.

FIG. 12 shows a top-view of an exemplary semiconductor wafer 75 and different suspended-membrane MMIC chips 70a, 70b and 70c. The close up top-view of the MMIC chip 70a depicts etch lines 76 that define the SS-MMIC chip 70a.

Figure 13:
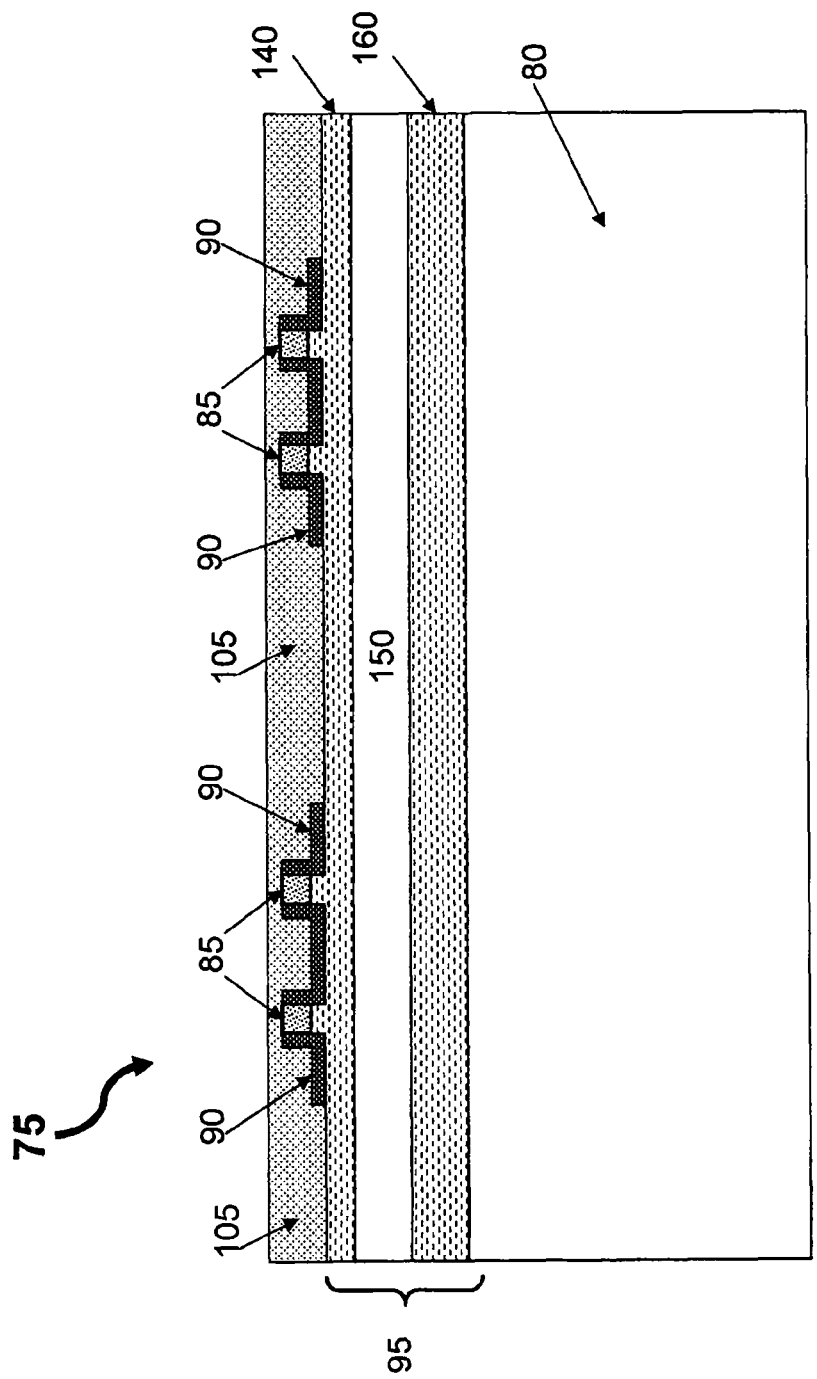
FIG. 13 depicts a side view of the SM-MMIC chip shown in FIG. 12 prior to backside processing in accordance with the present disclosure.

FIG. 13 depicts a cross-sectional view of a portion of the semiconductor wafer 75, containing MMIC chips 70a and 70c, wherein the devices 85 and transmission mediums 90 are formed after front-side processing is complete. A dielectric material 105 may be used to cover the devices 85 and transmission mediums 90.

One exemplary method of backside processing of a portion of the wafer 75 is shown and described with reference to FIGS. 14a-g. FIGS. 14a-g represent the cross section of the wafer 75 in each of the backside process steps.

In FIG. 14a, the wafer 75 is mounted with the devices 85 and the transmission mediums 90 on a support substrate 148 and held in place with a wax or other suitable material 145. The substrate 80 can be a semi-insulating semiconductor material, InP wafer, for example.

In FIG. 14b, a thinning process is performed on the substrate 80. The thinning process can be performed, for example, either by lapping the substrate 80; by etching the substrate 80 (wet or dry); grinding the substrate 80; or by a combination of any of these processes. The backside of the thinned substrate is then covered with metallization 91.

In FIGS. 14c-e, patterning of the substrate 80 is performed. The patterning process can be performed by: applying and imaging a mask 170 to the substrate 80, as shown by FIG. 14c; creating an etch pattern 175 in the etch mask 170, as shown by FIG. 14d; etching substrate holes 180 in the substrate 80 and removing the etching mask 170, as shown by FIG. 14e. The substrate holes 180 may be etched till the etch-stop layer 160 is reached. The etching mask 170 can be, but is not limited to, a photoresist material.

In FIGS. 14f and 14g, a disjoin process is performed on the substrate 80. Upon completion of the disjoin process the individual SM-MMIC chips 70a and 70c on the mounting substrate 148 will be disjoined from each other. The disjoin process can be performed by: applying and imaging an integrated circuit mask 190 to the substrate 80 exposing only the portions of the substrate 80 that are between the individual SM-MMIC chips 70a and 70c, as shown by FIG. 14f; etching through the substrate 80 and through the layers 160, 150, 140 as well as material 145 to form through streets 195 and removing the integrated circuit mask 190, as shown by FIG. 14g.

Alternatively, the process of disjoining the individual SM-MMIC chips 70a and 70c from the wafer can be accomplished by a laser die cutting process instead of masking and etching. The laser cutter is guided where the cutting is to be performed. Upon completion of the laser die cutting process, the individual SM-MMIC chips 70a and 70c will be disjoined from each other, by dissolving the material 145.

Finally, removing the material 145 enables removal of the individual SM-MMIC chips 70a and 70c from the support substrate 148. The material 145 can, for example, be removed with solvents, such as, Tetra-chloro-ethylene (TCE).

This disclosure is not in any way limited by the shape or thickness of the substrate 80 as depicted in FIGS. 9 through 14.

Figure 15:
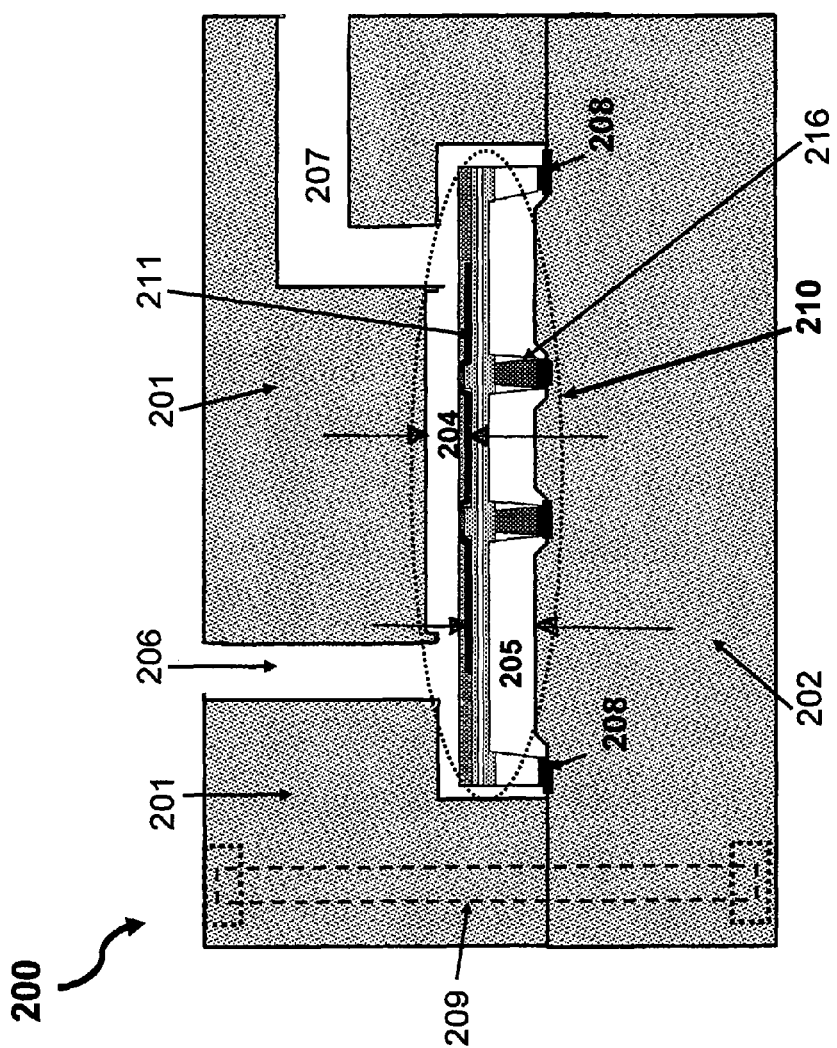
FIG. 15 depicts another exemplary SM-MMIC module containing a SM-MMIC chip with heatsink in accordance with the present disclosure.

In another exemplary embodiment, the present disclosure addresses the issues of high-losses and substrate parasitic modes and power dissipation issues in MMICs by disclosing a Suspended-Membrane MMIC (SM-MMIC) module 200 containing a SM-MMIC chip 210 with heatsinks 216, as shown in FIG. 15. FIG. 15 depicts a cross-sectional view of the SM-MMIC module 200.

The SM-MMIC module 200 may contain the SM-MMIC chip 210 disposed between a lower split-block 202 and an upper split-block 201; an input waveguide 206 may be formed in the upper split-block 201; and an output waveguide 207 may be formed in the upper split-block 201. The SM-MMIC module 200 may also contain metal contacts 208 to support the SM-MMIC module 200 and a fastener 209 for holding the upper split-block 201 and the lower split-block 202 together.

Figure 16:
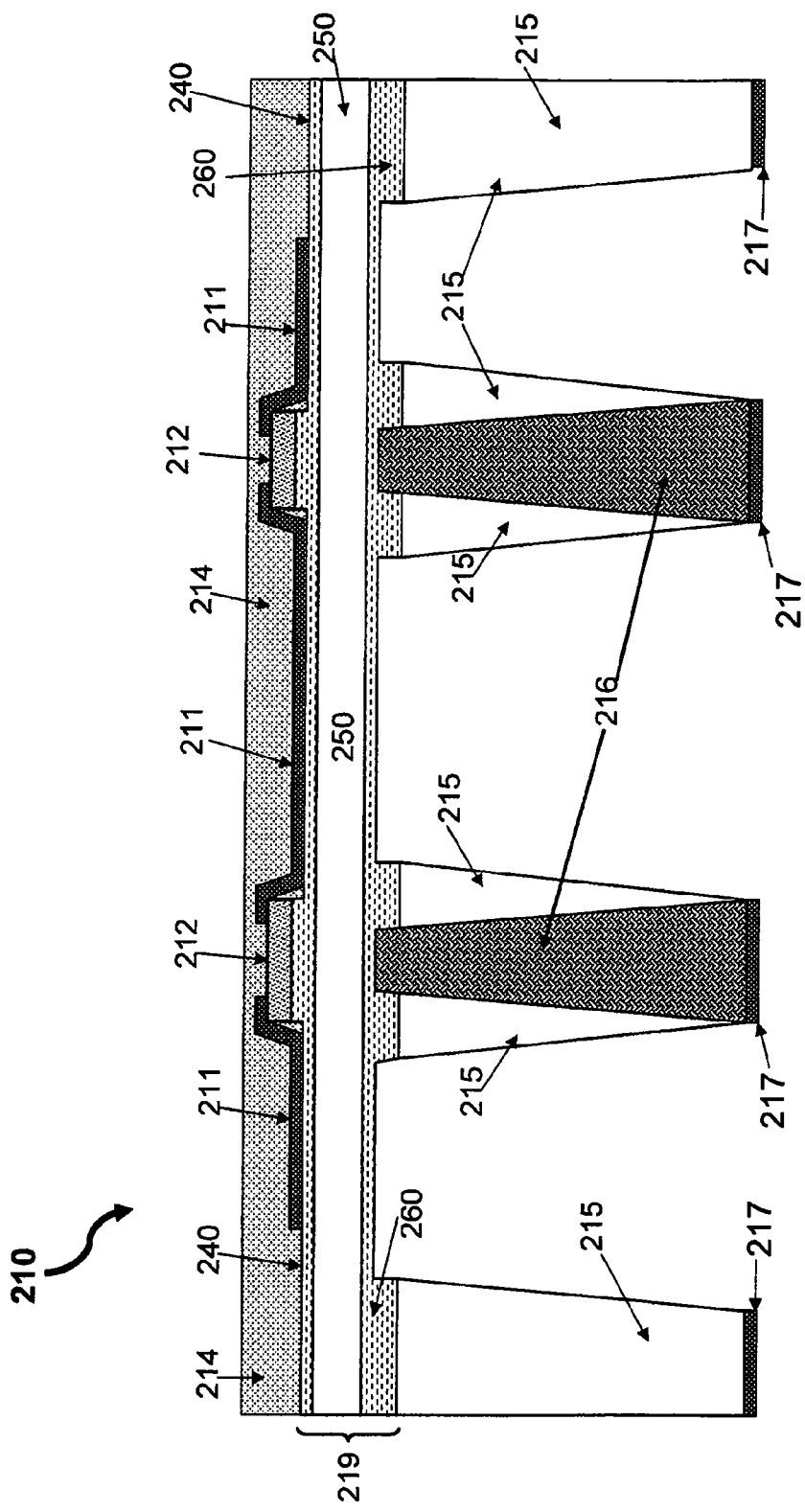
FIG. 16 depicts a side view of the SM-MMIC chip shown in FIG. 15 in accordance with the present disclosure.

FIG. 16 depicts a cross-sectional view of the SM-MMIC module 200. Referring to FIG. 16, the SM-MMIC 210 may consist of three-terminal devices 212 coupled to transmission mediums 211 that are disposed on a substrate 215 with non-uniform thickness and heatsinks 216 under the device 212. The heatsinks 216 may also be located on either side (not shown) of the device 212. The SM-MMIC chip 210 may also contain membrane layer 250 sandwiched between an etch-stop layers 240 and 260 that are disposed between the three-terminal devices 212 and the substrate 215. A suspended-membrane 219 is a combination of layers 240, 250 and 260 as shown in FIG. 16. The non-uniform thickness of the substrate 215 reduces SM-MMIC chip 210's high losses and parasitic modes at submillimeter wave frequencies. The heatsinks 216 may further improve the performance of the SM-MMIC chip 210 by dissipating power generated by the three-terminal devices 212.

The SM-MMIC chip 210 may also contain a dielectric material 214 disposed above the devices 212, bias pads 223, ground pads 224, and metallization layer 217 for connecting to the SM-MMIC chip 210 to the SM-MMIC module 200. An impedance of the transmission mediums 211 can be varied by changing distance 204, that is the distance from the SM-MMIC chip 210's suspended-line 211 and the upper split-block 201, and a distance 205, that is the distance from the SM-MMIC chip 210's line 211 and the lower split-block 202 as shown in FIG. 15.

Figure 17C:
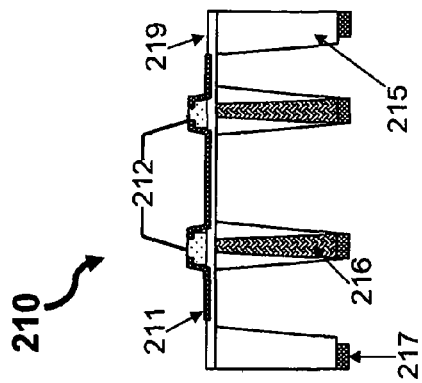
FIGS. 17a-17c depict a top view, a sectional side view and a bottom view of the SM-MMIC chip shown in FIG. 16 in accordance with the present disclosure.
Figure 17A:
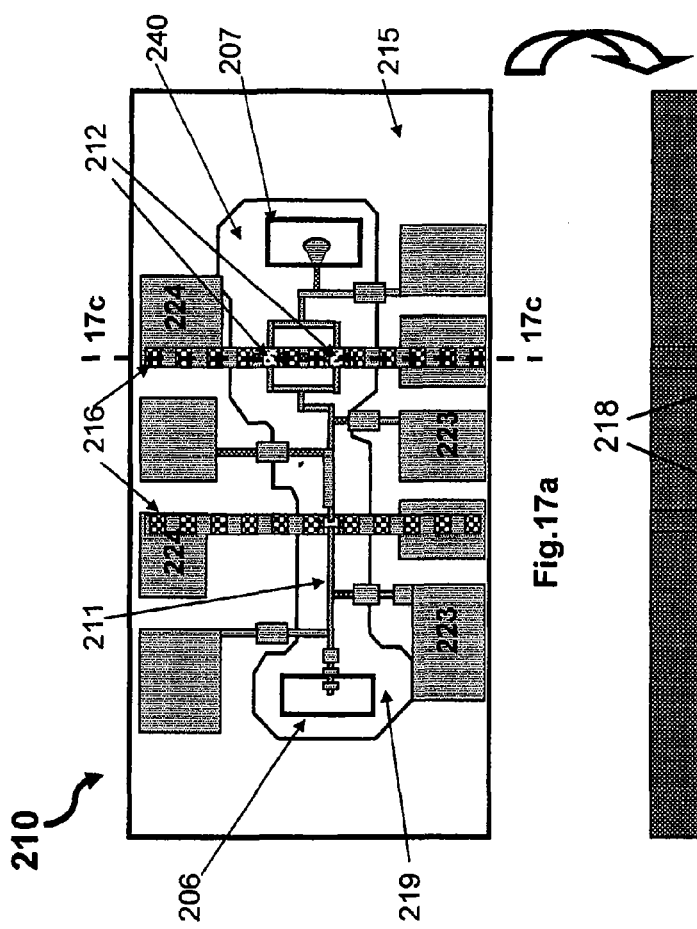
Figure 17B:
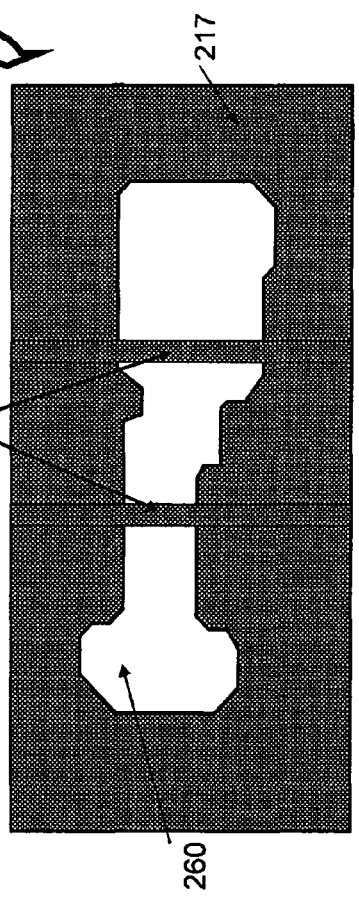

FIG. 17a depicts a top view of the SM-MMIC chip 210. FIG. 17b depicts a cutaway sideview of the SM-MMIC chip 210 along the line 17b-17b. FIG. 17c depicts a bottom view of the SS-MMIC chip 210.

Figure 18:
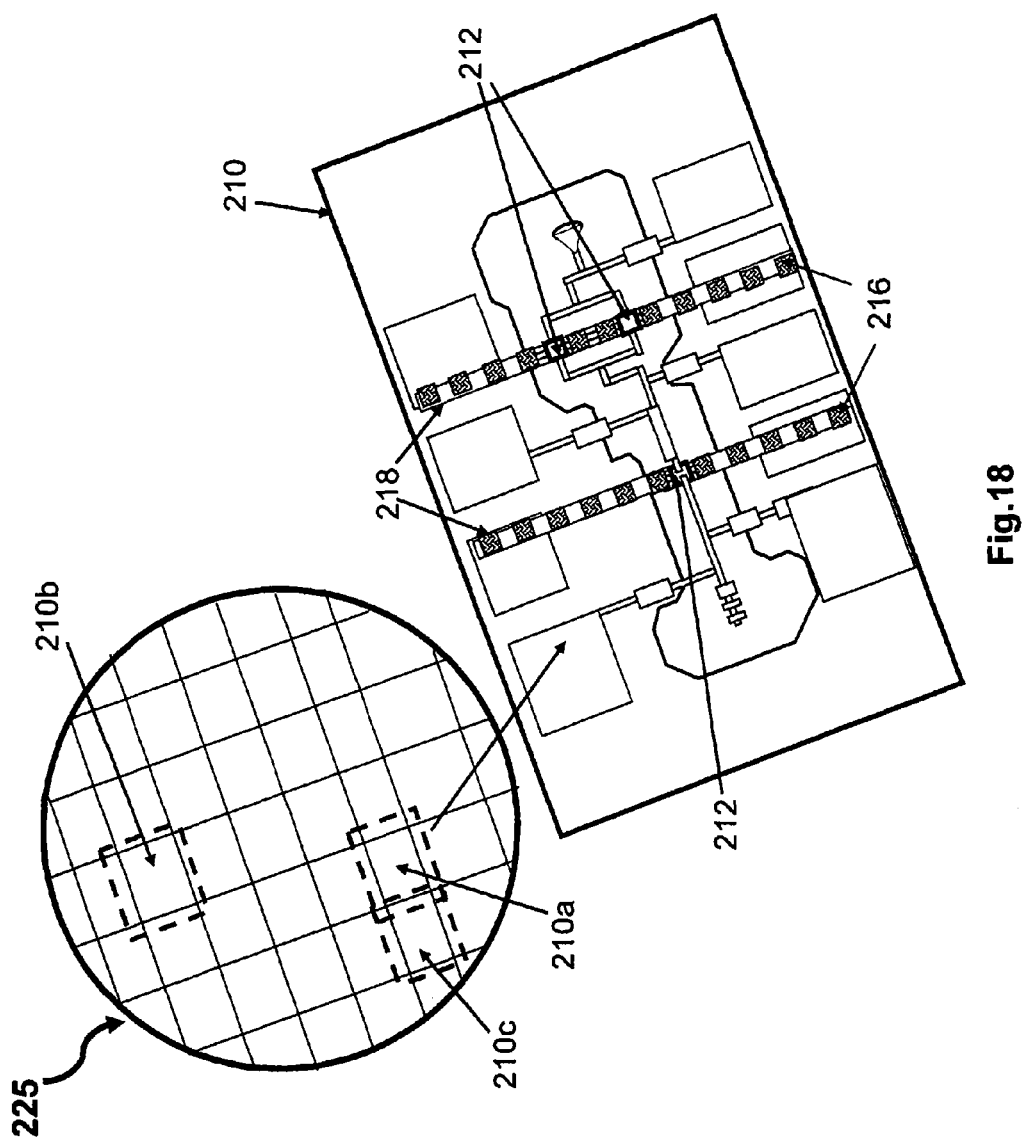
FIG. 18 depicts a top view of a semiconductor wafer containing the SM-MMIC chip shown in FIG. 16 in accordance with the present disclosure.

FIG. 18 shows the top-view of an exemplary semiconductor wafer 225 and different suspended-membrane MIMIC chips 210a, 210b and 210c. The close up top view of the SM-MMIC chip 210a shows the heatsink vias 216 along the heatsink beams 218 that are across the SM-MMIC chip 210. The vias along the heatsink beams 218 may increase the robustness of the SM-MMIC chip 210a.

As shown in FIG. 17a, the SM-MMIC chip 210's devices 212 are connected to transmission mediums 211, bias pads 223 and ground pads 224. The ground pads 224 may be formed by removing portions of the substrate 215. The SM-MMIC chip 210 may contain an etch-stop layers 240 and 260 and a membrane layer 250 disposed between the devices 212 and the substrate 215 as shown in FIG. 16. The characteristics of the transmission mediums 211 can be varied by changing distance 204, that is the distance from the transmission mediums 211 to the upper split-block 201, and distance 205, that is the distance from the transmission medium 211 to the lower split-block 202 as shown in FIG. 15.

This disclosure is not limited to heatsinks 216 being formed as vias that go through the etch stop layers 240 and 260 to be disposed next to the three-terminal devices 212 as depicted in FIGS. 16, 17 and 18. The heatsinks 216 may be disposed under and/or around the three-terminal devices 212 without going through the etch stop layers 240 and 260 (not shown).

Figure 19:
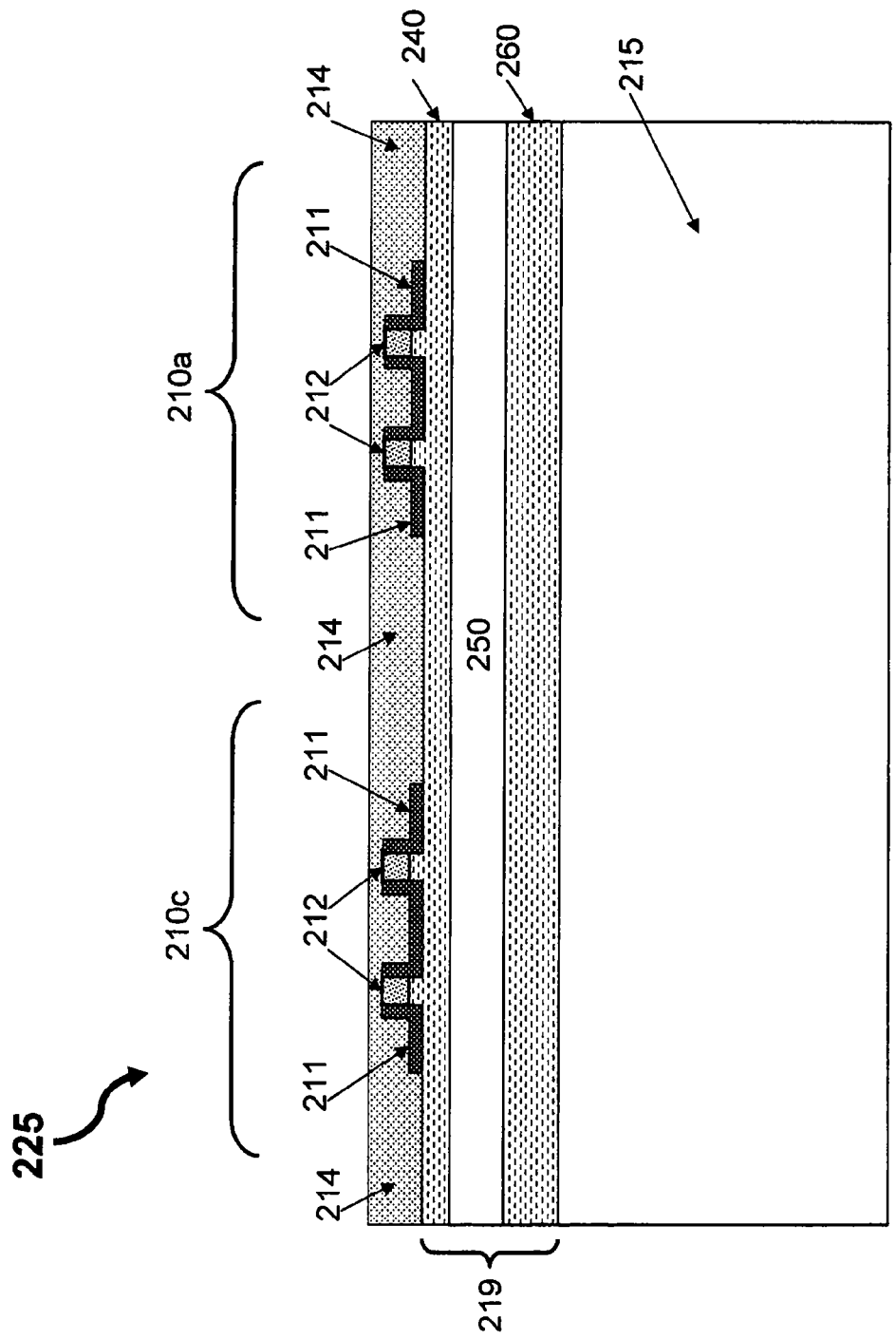
FIG. 19 depicts a side view of the SM-MMIC chips shown in FIG. 18 prior to the backside processing in accordance with the present disclosure.

FIG. 19 depicts a cross-sectional view of a portion of the semiconductor wafer 225, containing MMIC chips 210a and 210c, wherein the devices 212 and transmission mediums 211 are formed after front-side processing is complete. A dielectric material 214 may be used to cover the devices 212 and transmission mediums 211.

One exemplary method of backside processing of a portion of the wafer 225 is shown and described with reference to FIGS. 20a-j. FIGS. 20a-j represent the cross section of the wafer 225 in each of the backside process steps.

In FIG. 20a, the wafer 225 is mounted with the devices 212 and transmission mediums 211 on a support substrate 248 and held in place with a wax or other suitable material 245. The substrate 215 can, for example, comprise InP material.

In FIG. 20b, a thinning process is performed on the substrate 215. The thinning process can be performed, for example, either by lapping the substrate 215; by etching the substrate 215 (wet or dry); grinding the substrate 215; or by a combination of any of these processes.

In FIGS. 20c-h, a heat-sink deposition process and etching of the substrate 215 are performed. The heat-sink deposition process can be performed by: applying and imaging a via mask 221 to the substrate 215, as shown by FIG. 20c; creating a via pattern 222 in the via mask 221, as shown by FIG. 20d; etching via holes 223 through the substrate 215 and removing the via mask 221, as shown by FIG. 20e; depositing a metallization layer 242 to the backside of the substrate 215 thereby covering via holes 223 with metal, as shown by FIG. 20f; applying and imaging a metal mask 243 as shown by FIG. 20g; etching the metallization layer 241, etching the substrate 215 and removing the metal mask 243, as shown by FIG. 20h.

In FIG. 20h, 247 represent the InP frame with bottom metallization, 246 shows the created membrane hole area after substrate removal/etching process, and 244 represent via beams under the device 212. The via-beam structures can also be created around the device 212 (not shown). The metal-vias around the device 212 can be connected to the frontside ground metal by through-via structures (not shown).

The via mask 210 and metal mask 243 can be but are not limited to a photoresist material. The metallization layer 241 can consist of but is not limited to first depositing Ti followed by Au metals. The metallization layer 241 can be developed by either evaporating or sputtering metal onto substrate 215 and then plating metal to desired thickness. Etching of the metallization layer 241 can be done through wet etch technique. Wet etching can consist of applying potassium iodide, to etch Au followed by hydrofluoric acid to etch Ti.

In FIGS. 20i and 20j, a disjoin process is performed on the substrate 215. Upon completion of the disjoin process the individual SM-MMIC chips 210a and 210c on the wafer 225 will be disjoined from each other. The disjoin process can be performed by: applying and imaging an integrated circuit mask 281 to the substrate 215 exposing only the portions of the substrate 215 that are between the individual SM-MMIC chips 210a and 210c, as shown by FIG. 20i; etching through the substrate 215 and layers 240, 250, 260 to form through streets 285, and removing the integrated circuit mask 281, as shown by FIG. 20j.

Alternatively, the process of disjoining the individual SM-MMIC chips 210a and 210c from the wafer 225 can be accomplished by a laser die cutting process instead of masking and etching. The laser cutter is guided where the cutting is to be performed. Upon completion of the laser die cutting process, the individual SM-MMIC chips 210*a* and 210*c* will be disjoined from each other, as shown by FIG. 20*j*.

Finally, removing the material 245 enables removal of the individual SM-MMIC chips 210*a* and 210*c* from the support substrate 248. The material 245 can be removed with solvents, such as, Tetra-chloro-ethylene (TCE).

Figure 21:
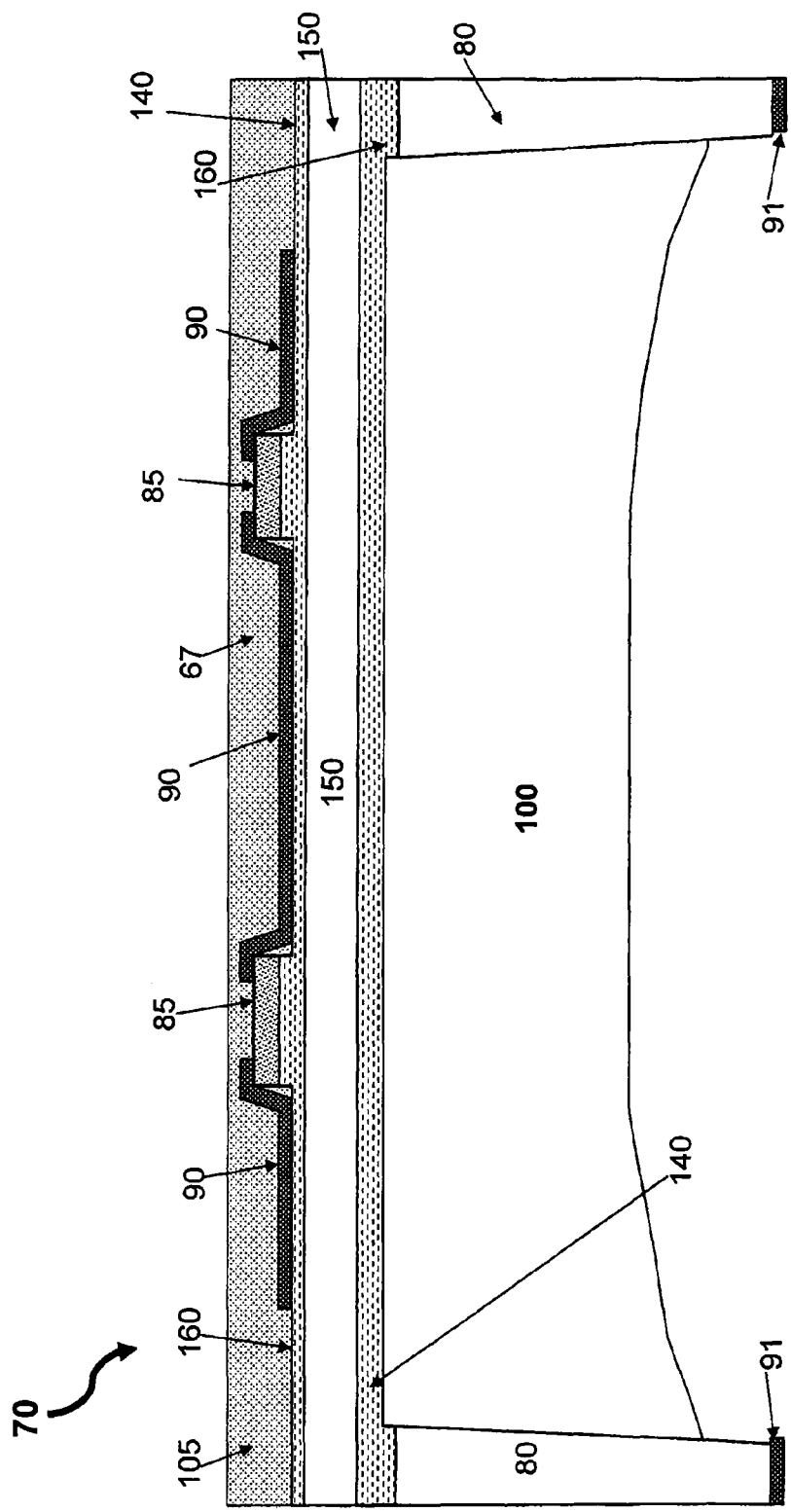
FIG. 21 depicts a side view of the SM-MMIC chip shown in FIG. 10 with a dielectric filling in accordance with the present disclosure.
Figure 22:
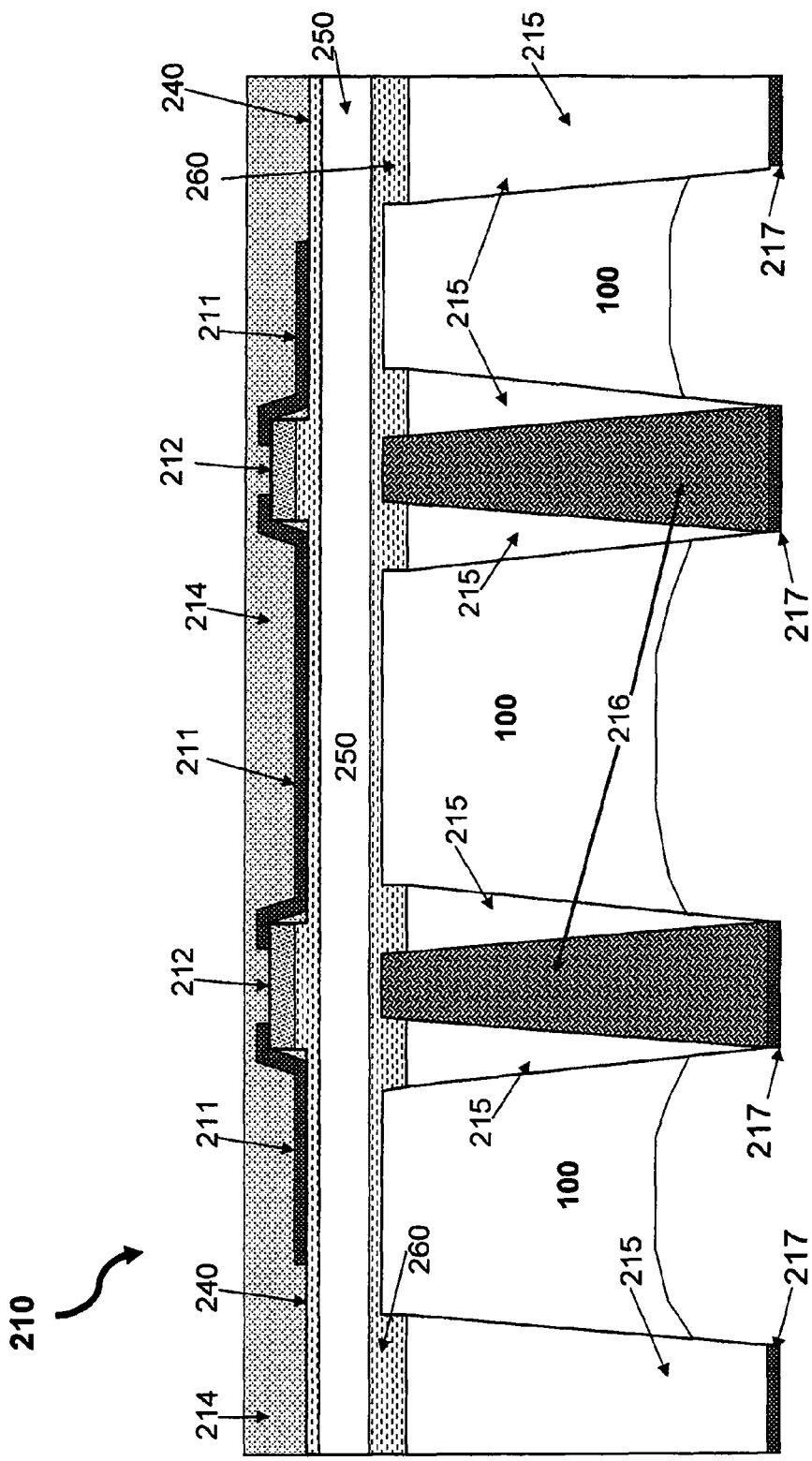
FIG. 22 depicts a side view of the SM-MMIC chip shown in FIG. 16 with a dielectric filling in accordance with the present disclosure.

In another exemplary embodiment, the SM-MMIC chips 70 and 210 disclosed above may comprise dielectric material 100, as depicted in FIGS. 21 and 22 to make the SM-MMIC chips 70 and 210 more rigid and easier to handle during processing. The dielectric material 100 may, for example, comprise of comprise any high-performance dielectric material, such as spin-on glass, BCB, polyimide and other suitable materials.

This disclosure is not limited to the SS-MMIC and SM-MMIC modules described above. It is to be understood that the exemplary SS-MMIC and SM-MMIC chips described above may be designed differently and/or placed into other waveguide modules known in the art.

Figure 23:
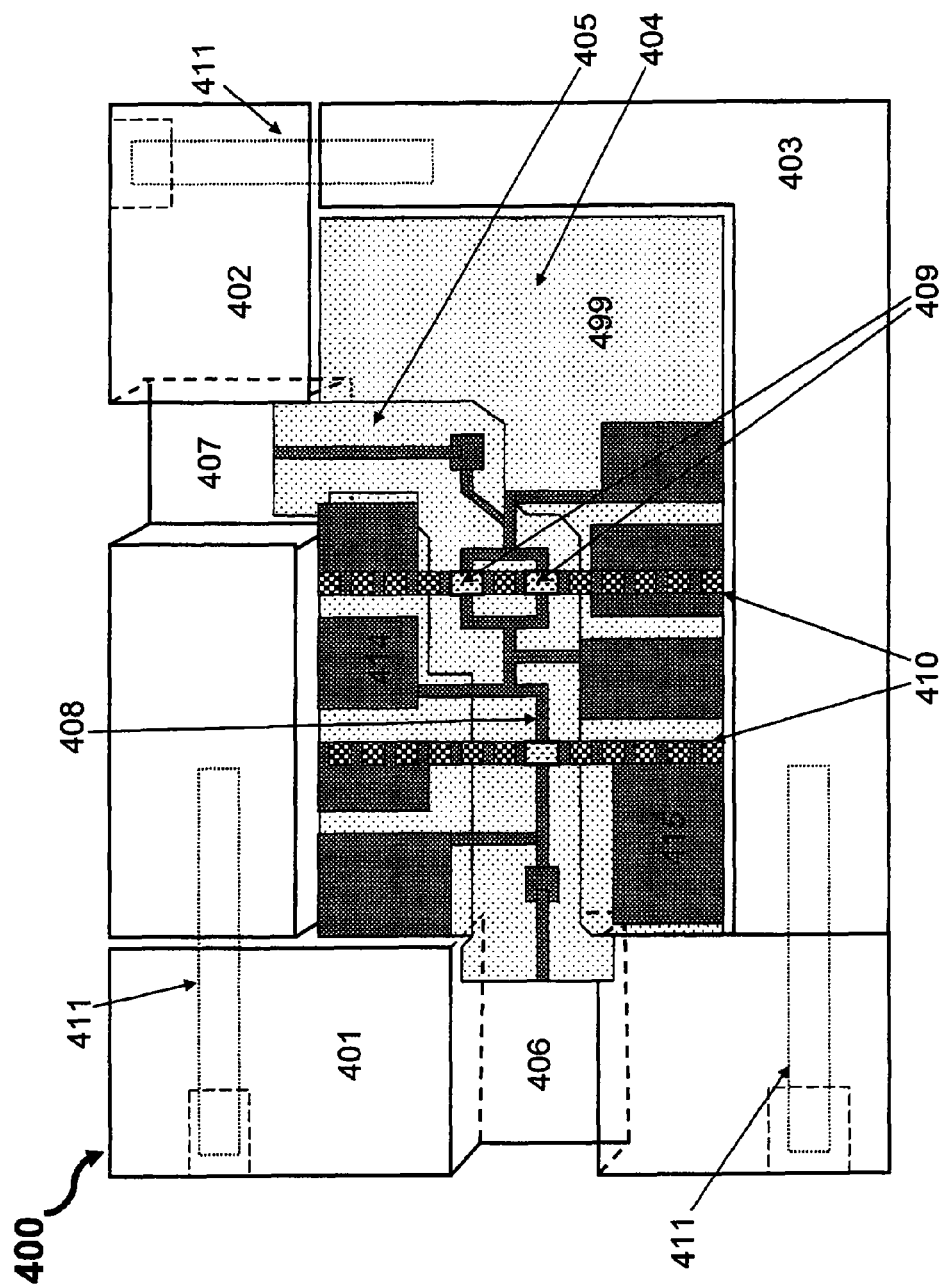
FIG. 23 depicts an exemplary portion of another SM-MMIC module containing a SM-MMIC chip in accordance with the present disclosure.

FIG. 23 depicts a top view of another design of a SM-MMIC module 400 comprising SM-MMIC chip 499. The chip 499 can be a SS-MMIC or SM-MMIC with heatsink as disclosed above. The top part of the split-block module is not shown in this FIG. 23. The bottom part of the module consists of three different pieces, 401, 402, 403 and joined together by screws 411. 406 and 407 are the lower half of the input and output waveguides. Devices 409, metal lines 408, pads 414 and 415, support substrate 404, suspended-membrane 405 are the integrated parts of the suspended-membrane MMIC structure. Heatsink beams 410 can be integrated for modular SM-MMICs with heatsink.

Figure 24:
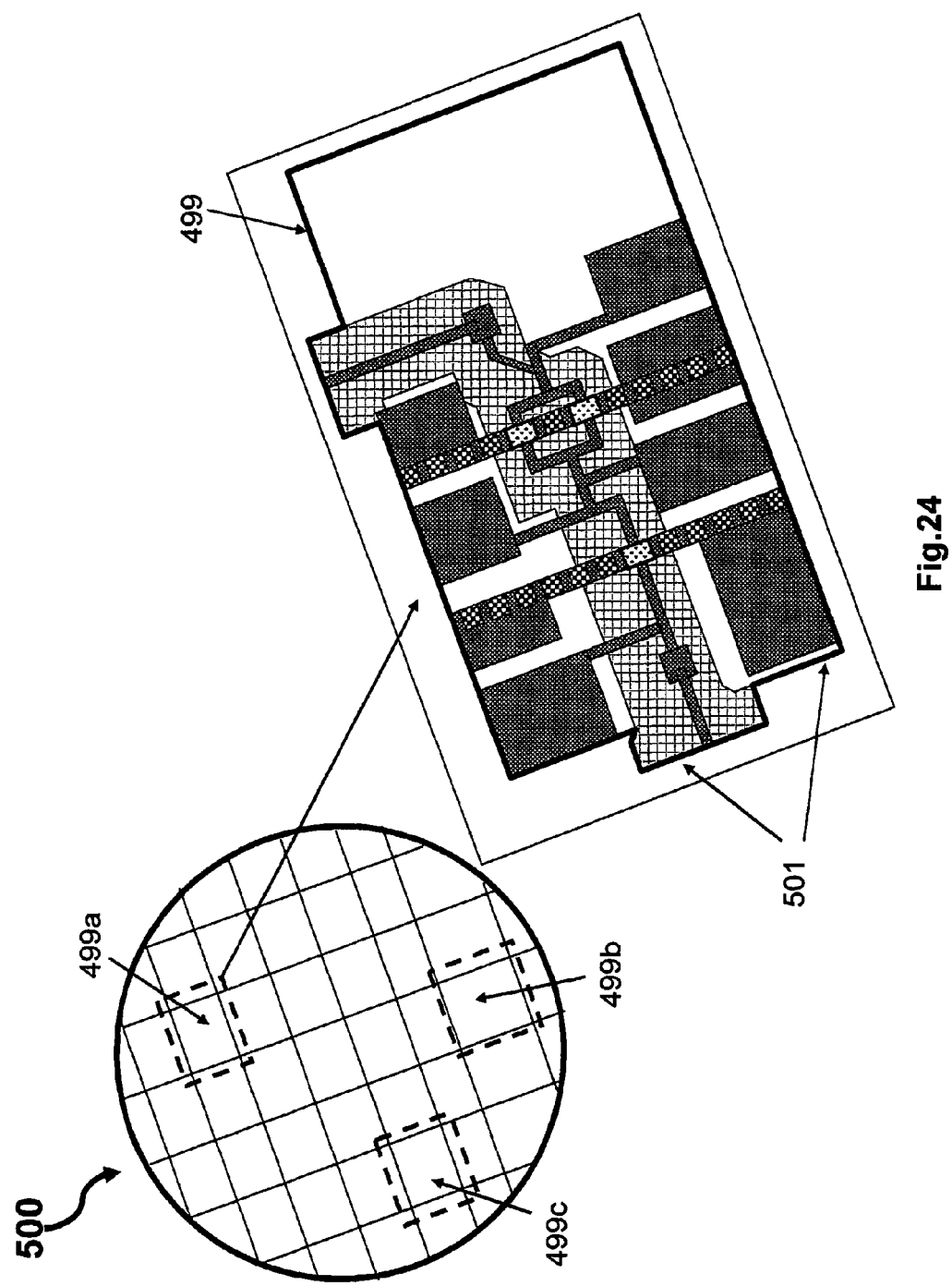
FIG. 24 depicts a top view of a semiconductor wafer containing the SM-MMIC chip shown in FIG. 23 in accordance with the present disclosure.

FIG. 24 shows the top-view of a semiconductor wafer 500 and the different suspended-membrane IvIMIC chips 499*a*, 499*b* and 499*c*. The close up top-view of the MMIC chips 499*a*, depicts lines 501 that defines the MMIC chips 499*a*.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied there from. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . . "

What is claimed is:

1. A method for manufacturing a device, the method comprising:
   selecting a substrate having a first portion and a plurality of discrete second portions extending from the first portion;
   forming a plurality of transistors being supported by the first portion;
   forming a plurality of transmission mediums connected to the transistors being supported by the first portion; and
   forming a heat-sink within at least one of the second portions.

2. The method of claim 1, further comprising:
   selecting an upper split block; and
   selecting a lower split block for supporting the upper split block and the plurality of discrete second portions.

3. A method of manufacturing a device, the method comprising:
   selecting a substrate having a first portion and a plurality of discrete second portions extending from the first portion in a direction perpendicular to a major surface of said first portion, the plurality of second portions providing feet for mounting said first portion spaced from a device support surface;
   forming a plurality of active devices supported by the first portion;
   forming a plurality of transmission mediums connected to the active devices supported by the first portion; and
   disposing at least one heat-sink disposed within at least one of the second portions.

4. The method of claim 3, wherein at least a portion of the second portions are disposed not directly underneath the active devices and the transmission mediums.

5. The method of claim 3, wherein the at least one heat-sink within the second portion is disposed under at least one of the active devices.

6. The method of claim 3, wherein the at least one heat-sink within the second portion is disposed next to at least one of the active devices.

7. The method of claim 3, further comprising:
   forming an upper split block; and
   forming a lower split block supporting the upper split block and the plurality of discrete second portions.

8. The method of claim 3, further comprising:
   forming a first etch-stop layer disposed between the substrate and the active devices;
   forming a membrane layer disposed between the first etch-stop layer and the active devices; and
   forming a second etch-stop layer disposed between the membrane layer and the active devices.

9. The method of claim 3, further comprising disposing a dielectric material between the plurality of discrete second portions.

10. The method of claim 3, wherein said active devices are transistors.

11. A method of manufacturing a device, the method comprising:
    forming a plurality of active devices;
    forming a plurality of transmission mediums connected to the active devices;
    forming a first etch-stop layer supporting the active devices and the transmission mediums thereon;
    forming a membrane layer supporting the first etch-stop layer a thereon;
    forming a second etch-stop layer supporting the membrane layer thereon; and forming a plurality of discrete substrate portions disposed under the second etch-stop layer.

12. The method of claim 11, wherein at least portions of the discrete substrate portions are not directly disposed underneath the active devices and the transmission mediums.

13. The method of claim 11, further comprising disposing a heat-sink within at the one portion of at least one of the discrete substrate portions.

14. The method of claim 13, wherein at least one of the discrete substrate portions with the heat-sink disposed therein is disposed under at least one active device of in the plurality of active devices.

15. The method of claim 13, wherein the heat-sink is formed by forming a via that extends into the second etch-stop layer.

16. The method of claim 11, further comprising:
forming an upper split block; and
forming a lower split block supporting the upper split block and the plurality of discrete second substrate portions.

17. The method of claim 11, further comprising a dielectric material disposed between the plurality of discrete substrate portions.

18. The method of claim 11 wherein said active devices are transistors.

19. A method of making a suspended-substrate monolithic device disposed in a waveguide guide, the method comprising:
forming a plurality of multi-terminal devices;
forming a plurality of transmission mediums connected to the multi-terminal devices; and
forming a substrate having a first portion and a plurality of second portions, said first portion supporting the multi-terminal devices and the transmission mediums thereon and the plurality of second portions extending from the first portion in a direction away from said first portion, the plurality of second portions (i) being fixed to an interior surface or portion of said waveguide and (ii) supporting said first portion, including said multi-terminal devices and said transmission mediums, within said waveguide spaced from interior surfaces of said waveguide so that at least a majority of said first portion does not physically contact any portion of said waveguide.

* * * * *